(12) United States Patent
Nii

(10) Patent No.: US 6,590,802 B2
(45) Date of Patent: Jul. 8, 2003

(54) SEMICONDUCTOR STORAGE APPARATUS

(75) Inventor: Koji Nii, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/141,139

(22) Filed: May 9, 2002

(65) Prior Publication Data

US 2003/0090929 A1 May 15, 2003

(30) Foreign Application Priority Data

Nov. 13, 2001 (JP) .................................... 2001-347370

(51) Int. Cl.[7] ............................................. G11C 11/00
(52) U.S. Cl. ................... 365/156; 365/154; 365/230.05
(58) Field of Search ................. 365/156, 154, 365/230.05, 63, 51

(56) References Cited

U.S. PATENT DOCUMENTS 5,338,963 A      8/1994  Klaasen et al. ............ 257/376
5,754,468 A  *  5/1998  Hobson ....................... 365/156
5,877,976 A  *  3/1999  Lattimore et al. ............ 365/63
6,347,062 B2 *  2/2002  Nii et al. ............... 365/230.05
6,535,465 B1 *  3/2003  Nii et al. ............... 365/230.05

FOREIGN PATENT DOCUMENTS

| JP | 7-7089 | 1/1995 |
|----|--------|--------|
| JP | 10-178110 | 6/1998 |
| JP | 2001-28401 | 1/2001 |

* cited by examiner

Primary Examiner—Anh Phung
(74) Attorney, Agent, or Firm—Oblon, Spivak, McClelland, Maier & Neustadt, P.C.

(57) ABSTRACT

A semiconductor storage apparatus having an SRAM memory cell of a low power consumption type which can reduce a wiring length of a bit line. NMOS transistors (N1), (N3) and (N4) are formed in a P well region (PW0), NMOS transistors (N2), (N5) and (N6) are formed in a P well region (PW1), and a wiring direction (a second direction) of bit lines (BL1) and (BL2) (bit lines BL12 and BL22) is set to be orthogonal to a direction of separation arrangement (a transverse direction in the drawing; a first direction) of the P well regions (PW0) and (PW1). The P well region (PW0) and the P well region (PW1) are formed opposite to each other with an N well region (NW) interposed therebetween.

11 Claims, 23 Drawing Sheets

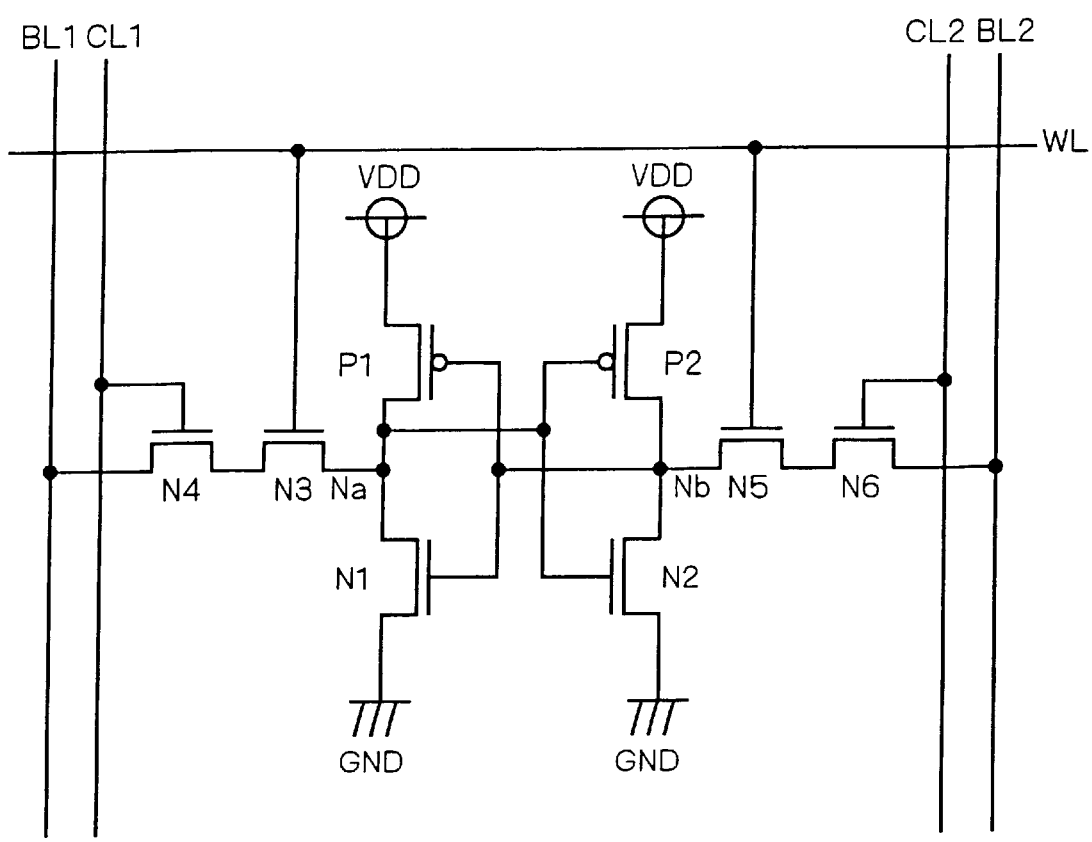
F I G . 5

SEMICONDUCTOR STORAGE APPARATUS

BACKGROUND OF THE INVENTION

1. Field of the Invention

The present invention relates to a memory cell structure of a semiconductor storage apparatus having an SRAM (Static RAM) memory cell.

2. Description of the Background Art

In recent years, it has been greatly demanded that the weights, thicknesses and sizes of electronic apparatuses should be reduced and the functions of the same apparatuses should be implemented at a high speed. Nowadays, it is essential that a microcomputer should be mounted on such electronic apparatuses. In the structure of the microcomputer, it is required that a memory having a large capacity and a high speed should be mounted. Moreover, it has been required that the capacity of a cache memory should be increased in order to implement a processing more quickly with the rapid spread and high performance of a personal computer. In other words, it has been necessary to increase the speed and capacity of an RAM to be used by a CPU during execution of a control program or the like.

While a DRAM (Dynamic RAM) and an SRAM are generally used for the RAM, the SRAM is usually used in a portion in which a processing is to be carried out at a high speed, for example, the cache memory. As the structure of a memory cell, there have been known an SRAM of a high resistance load type which is constituted by four transistors and two high resistance elements and an SRAM of a CMOS type which is constituted by six transistors. In particular, the SRAM of the CMOS type has a high reliability and is a present mainstream because of a very small leakage current during data hold.

In the memory cell, generally, a reduction in an element area implies the realization of an increase in a speed as well as a reduction in the size of a memory cell array. Conventionally, various layouts have been proposed for the memory cell structure in order to implement an operation of the SRAM to be carried out at a higher speed.

For example, according to "Semiconductor Storage Apparatus" disclosed in Japanese Patent Application Laid-Open No. 10-178110 (1998), a boundary line of a P well region and an N well region where an inverter constituting a memory cell is formed is arranged in parallel with a bit line so that a shape of a diffusion region in the P well region or the N well region and a shape of a cross connecting portion of two inverters can be simplified without a bent portion, resulting in a reduction in a cell area.

FIGS. 22 and 23 are views illustrating a layout structure of the "Semiconductor Storage Apparatus" disclosed in the Japanese Patent Application Laid-Open No. 10-178110 (1998) as seen on a plane. In particular, FIG. 22 shows a lower part including a diffusion region formed on a semiconductor substrate surface, a polycrystalline silicon film formed on an upper surface of the diffusion region and a first metal wiring layer formed on a first layer, and FIG. 23 shows an upper part including second and third metal wiring layers formed on second and third layers provided on an upper surface of the lower part.

As shown in FIG. 22, an N well region including PMOS transistors P101 and P102 is provided on a center of a memory cell, and a P well region including NMOS transistors N101 and N103 and a P well region including NMOS transistors N102 and N 104 are provided on both sides thereof.

The PMOS transistors P101 and P102 and the NMOS transistors N101 and N102 are mutually cross connected to constitute a CMOS inverter, that is, a flip-flop circuit, and the NMOS transistors N103 and N104 correspond to access gates (transfer gates).

As shown in FIG. 23, moreover, bit lines BL and $\overline{BL}$ are separately formed as the second metal wiring layers and each of them is connected to one of semiconductor terminals of each of the access gate MOS transistors N103 and N104 provided thereunder. Moreover, a power line Vdd is formed as the second metal wiring layer in parallel with the bit line in a central part between the bit lines BL and $\overline{BL}$, and is connected to one of semiconductor terminals (source—drain regions) of each of the PMOS transistors P101 and P102 provided thereunder. Furthermore, a word line WL is formed as the third metal wiring layer in a direction orthogonal to the bit lines BL and $\overline{BL}$ and is connected to gates of the NMOS transistors N103 and N104 provided thereunder. Moreover, a grounding conductor GND is formed as two third metal wiring layers in parallel with both sides of the word line WL.

Since the memory cell is formed in such a layout, an N-type diffusion region in the P well region provided with the MOS transistors N101 and N103 and an N-type diffusion region provided with the MOS transistors N102 and N104 can be formed rectilinearly in parallel with the bit lines BL and $\overline{BL}$. Thus, it is possible to prevent a wasteful region from being generated.

Moreover, a length of a cell in a transverse direction, that is, a length in a direction of the word line WL is relatively greater than a length in a longitudinal direction, that is, lengths of the bit lines BL and $\overline{BL}$. Therefore, a layout of a sense amplifier to be connected to the bit lines BL and $\overline{BL}$ can easily be obtained, and furthermore, the number of cells to be connected to one word line can be decreased and a cell current flowing during reading, that is, a consumed power can be reduced.

While the memory cell of the SRAM is an example of a so-called 1-port SRAM, a multiprocessor technique has recently been introduced as one of means for implementing an increase in the speed of a computer and it has been required that a plurality of CPUs should share one memory area. More specifically, various layouts have been proposed for a 2-port SRAM in which access can be given from two ports to one memory cell.

According to "Storage Cell" disclosed in Japanese Patent Application Laid-Open No. 07-7089 (1995), for example, a second port is provided symmetrically with a first port and is simultaneously formed together with the first port on the same layer so that a structure of a 2-port SRAM is implemented. FIG. 24 shows a layout of the "Storage Cell" disclosed in the Japanese Patent Application Laid-Open No. 07-7089 (1995).

In FIG. 24, PMOS transistors P201 and P202 and NMOS transistors N201a, N202a, N201b and N202b are mutually cross connected to constitute a CMOS inverter, that is, a flip-flop circuit, and NMOS transistors NA, NB, NA2 and NB2 correspond to access gates (transfer gates).

More specifically, in FIG. 24, the NMOS transistors NA and NB can give access from one of ports through a word line WL1 and the NMOS transistors NA2 and NB2 can give access from the other port through a word line WL2.

In a layout of a conventional 1-port SRAM memory cell having a 6-transistor structure, there has been a problem in that a wiring capacity of a bit line is large because of an increase in a length in a direction of a bit line and an access time becomes long because of an increase in a line capacity. Moreover, the directions of an access transistor and a driver transistor are different from each other. Therefore, there has been a problem in that it is hard to carry out optimization to have a desirable dimension and to maintain a margin for a variation in manufacture due to mask misalignment.

Referring to the SRAM memory cell having the 6-transistor structure, the "Semiconductor Storage Apparatus" disclosed in the Japanese Patent Application Laid-Open No. 10-178110 (1998) proposing a layout structure having a small length in a direction of a bit line solves the problems for the 1-port SRAM. The same contents have also been disclosed in Japanese Patent Application Laid-Open No. 2001-28401.

In the "Semiconductor Storage Apparatus", however, a 2-port SRAM generally comprising two sets of access gates and a driving type MOS transistor has not solved the problems described above. Moreover, the "Storage Cell" disclosed in the Japanese Patent Application Laid-Open No. 07-7089 (1995) has described a layout of a 2-port SRAM cell, and provides a layout in which a second port can easily be added without greatly changing a layout of a 1-port SRAM cell and does not have an object to reduce a size of the 2-port SRAM cell in a direction of a bit line.

Referring to an SRAM memory cell of a low power consumption type such as an SRAM memory cell having an 8-transistor structure of a low power consumption type which has a column selection signal line for further pressing a memory cell selected by a word line to be a row selection signal line into a direction of a column, similarly, a specific solving method for reducing a wiring length of a bit line has not been found.

SUMMARY OF THE INVENTION

It is an object of the present invention to provide a semiconductor storage apparatus comprising an SRAM memory cell having a low power consumption type transistor structure which can reduce a wiring length of a bit line.

The present invention is directed to a semiconductor storage apparatus including a memory cell having first and second inverters cross connected to each other, wherein first and second conductivity types are defined by one and another kinds, respectively, the first inverter has a first one kind field effect transistor and a first another kind field effect transistor, the second inverter has a second one kind field effect transistor and a second another kind field effect transistor, the first inverter has an output section including a connecting portion of one electrode of the first one kind field effect transistor and one electrode of the first another kind field effect transistor and an input section including a connecting portion of a control electrode of the first one kind field effect transistor and a control electrode of the first another kind field effect transistor, and the second inverter has an output section including a connecting portion of one electrode of the second one kind field effect transistor and one electrode of the second another kind field effect transistor and an input section including a connecting portion of a control electrode of the second one kind field effect transistor and a control electrode of the second another kind field effect transistor, the memory cell further includes third to sixth one kind field effect transistors, the third one kind field effect transistor has one electrode connected to a first storage terminal which is electrically connected to the output section of the first inverter and the input section of the second inverter and a control electrode connected to a row selection signal line, the fourth one kind field effect transistor has one electrode connected to the other electrode of the third one kind field effect transistor, the other electrode connected to a first bit line and a control electrode connected to a first column selection signal line, the fifth one kind field effect transistor has one electrode connected to a second storage terminal which is electrically connected to the output section of the second inverter and the input section of the first inverter and a control electrode connected to the row selection signal line, and the sixth one kind field effect transistor has one electrode connected to the other electrode of the fifth one kind field effect transistor, the other electrode connected to a second bit line and a control electrode connected to a second column selection signal line, and one of the first and second one kind field effect transistors is formed in a first another kind well region and the other is formed in a second another kind well region, the third and fourth one kind field effect transistors are formed in the first another kind well region, the fifth and sixth one kind field effect transistors are formed in the second another kind well region, the first and second another kind field effect transistors are formed in a one kind well region, and the first and second another kind well regions are arranged in a first direction with the one kind well region interposed therebetween and the first and second bit lines are extended in a second direction which is almost orthogonal to the first direction.

The first and second another kind well regions are arranged in the first direction with the one kind well region interposed therebetween, and the first and second bit lines are extended in the second direction which is almost orthogonal to the first direction. Therefore, the formation of the first and second another kind well regions does not influence the wiring lengths of the first and second bit lines.

As a result, the wiring lengths of the first and second bit lines can be reduced. Therefore, the semiconductor storage apparatus of the present invention can maintain a good access time.

Preferably, in the semiconductor storage apparatus of the present invention, the first one kind field effect transistor is formed in the second another kind well region, and the second one kind field effect transistor is formed in the first another kind well region.

The first and third one kind field effect transistors which have electrodes connected to the first storage terminal are separately formed into the second and first another kind well regions respectively, and the second and fifth one kind field effect transistors which have electrodes connected to the second storage terminal are separately formed into the first and second another kind well regions respectively.

Accordingly, in the case in which electrons generated by a rays or neutron rays are collected into one of the electrode regions of each of the first to third and fifth one kind field effect transistors which are formed in one of the first and second another kind well regions, the electrons are discharged from one of the electrode regions of the first to third and fifth one kind field effect transistors which are formed in the other another kind well region in which the influence of the generation of the electrons is prevented by the provision of the one kind well region. For example, the electrons collected into one of the electrode regions of the first one kind field effect transistor in the second another kind well region are discharged from one of the electrode regions of the third one kind field effect transistor in the first another kind well region through the first storage terminal and the electrons collected into one of the electrode regions of the second one kind field effect transistor in the first another kind well region are discharged from one of the electrode regions of the fifth one kind field effect transistor in the first another kind well region through the second storage terminal.

By such an operation, the generation of electrons to invert data held in the first and second storage terminals is offset. Consequently, the data are inverted with difficulty. As a result, it is possible to produce an effect that a soft error tolerance can be enhanced.

Preferably, in the semiconductor storage apparatus of the present invention, the row selection signal line includes first and second row selection signal lines, the first bit line includes a first positive-phase-sequence bit line and a first negative-phase-sequence bit line, the second bit line includes a second positive-phase-sequence bit line and a second negative-phase-sequence bit line, the control electrode of the third one kind field effect transistor is connected to the first row selection signal line, the other electrode of the fourth one kind field effect transistor is connected to the first positive-phase-sequence bit line, the control electrode of the fifth one kind field effect transistor is connected to the second row selection signal line, and the other electrode of the sixth field effect transistor is connected to the second negative-phase-sequence bit line, the memory cell includes seventh to tenth one kind field effect transistors, the seventh one kind field effect transistor has one electrode connected to the second storage terminal and a control electrode connected to the first row selection signal line, the eighth one kind field effect transistor has one electrode connected to the other electrode of the seventh one kind field effect transistor, the other electrode connected to a first negative-phase-sequence bit line and a control electrode connected to the first column selection signal line, the ninth one kind field effect transistor has one electrode connected to the first storage terminal and a control electrode connected to the second row selection signal line, and the tenth one kind field effect transistor has one electrode connected to the other electrode of the ninth one kind field effect transistor, the other electrode connected to a second positive-phase-sequence bit line and a control electrode connected to the second column selection signal line, and the seventh and eighth one kind field effect transistors are formed in the first another kind well region, the ninth and tenth one kind field effect transistors are formed in the second another kind well region, and the first and second positive-phase-sequence bit lines and the first and second negative-phase-sequence bit lines are extended in the second direction.

The third and ninth one kind field effect transistors which have electrodes connected to the first storage terminal are separately formed into the first and second another kind well regions respectively, and the fifth and seventh one kind field effect transistors which have electrodes connected to the second storage terminal are separately formed into the second and first another kind well regions respectively.

By the same operation as that of the semiconductor storage apparatus according to the present invention described above, therefore, the generation of electrons to invert the data held in the first and second storage terminals is offset. Consequently, the data are inverted with difficulty. As a result, it is possible to produce an effect that a soft error tolerance can be enhanced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a circuit diagram showing an equivalent circuit of the memory cell according to the first embodiment illustrated in FIGS. 1 to 4.

DESCRIPTION OF THE PREFERRED EMBODIMENTS

First Embodiment

Figure 1:
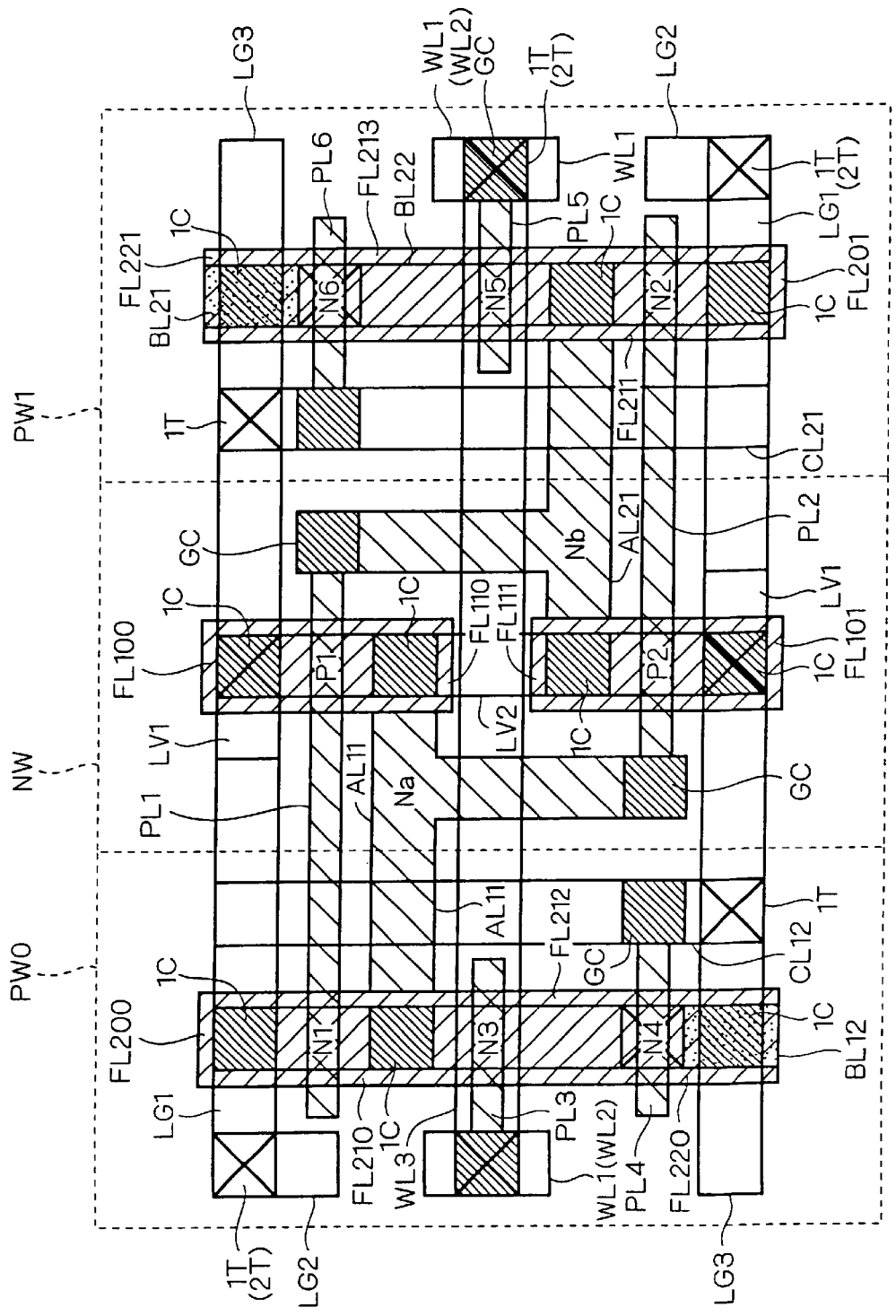
FIG. 1 is a view illustrating a layout structure of all layers of a memory cell in an SRAM according to a first embodiment of the present invention, which is seen on a plane.
Figure 2:
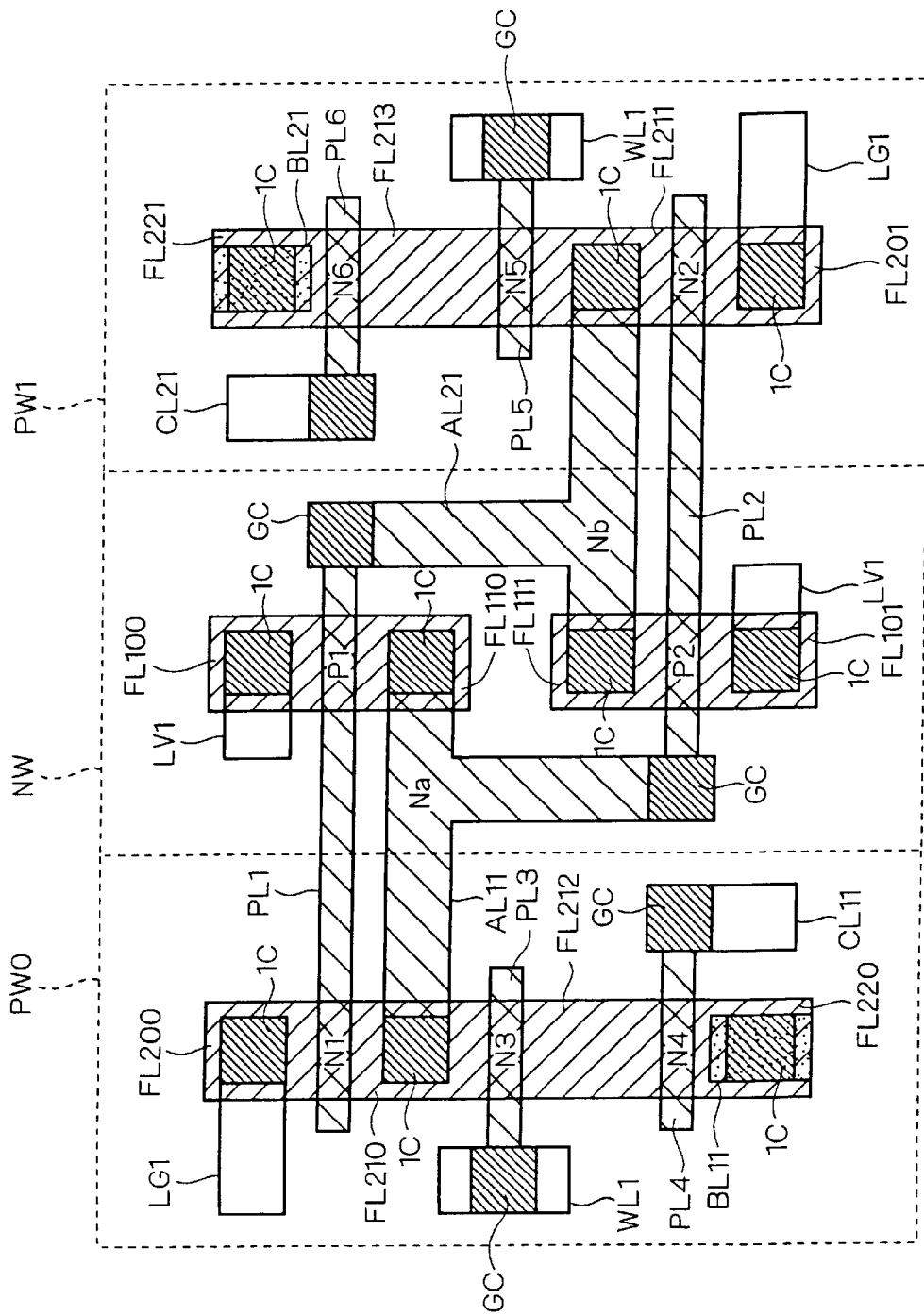
FIG. 2 is a view mainly illustrating a layout structure of a portion provided under a first aluminum wiring layer in FIG. 1, which is seen on a plane.
Figure 3:
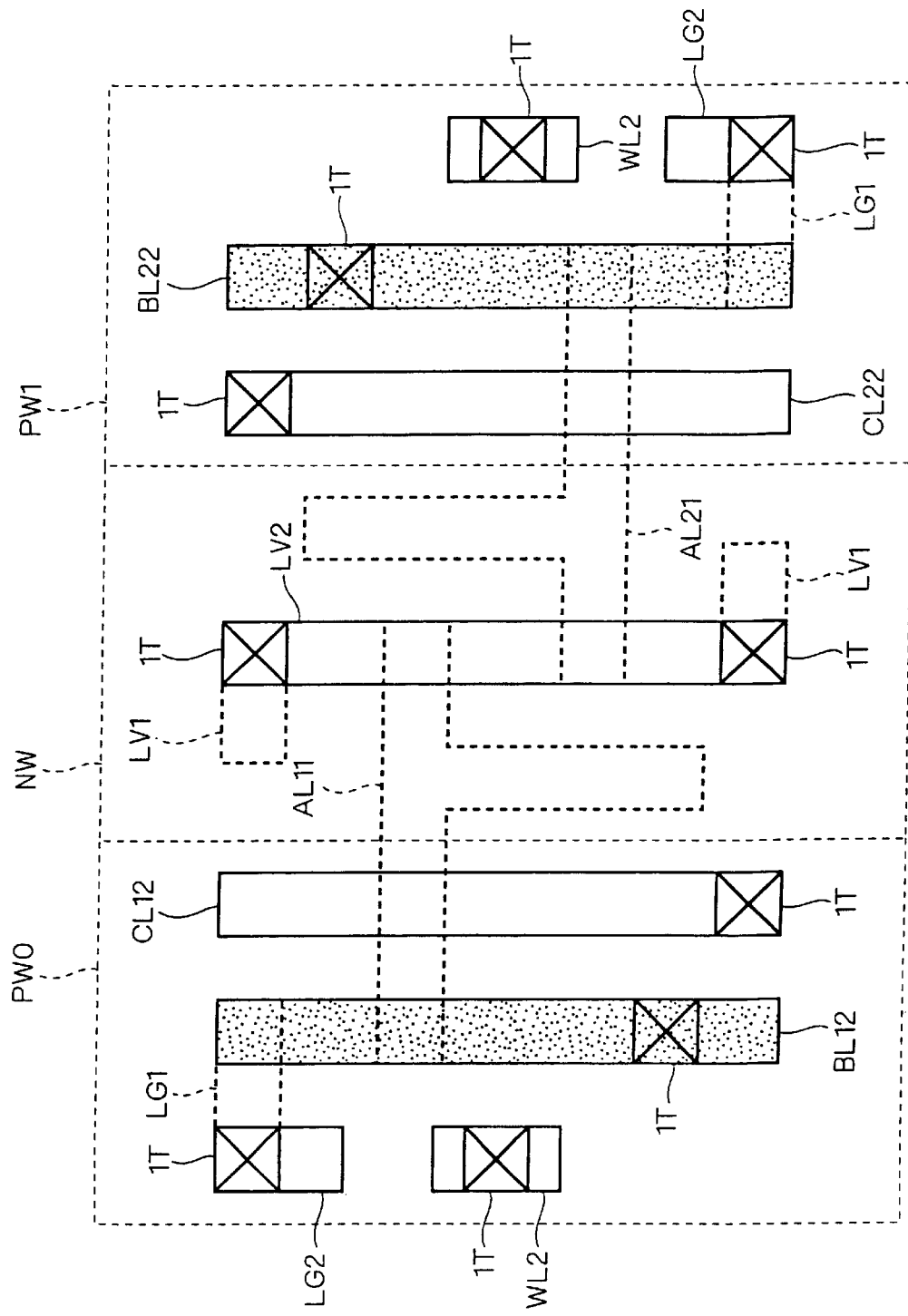
FIG. 3 is a view mainly illustrating a layout structure of a second aluminum wiring layer in FIG. 1, which is seen on a plane.
Figure 4:
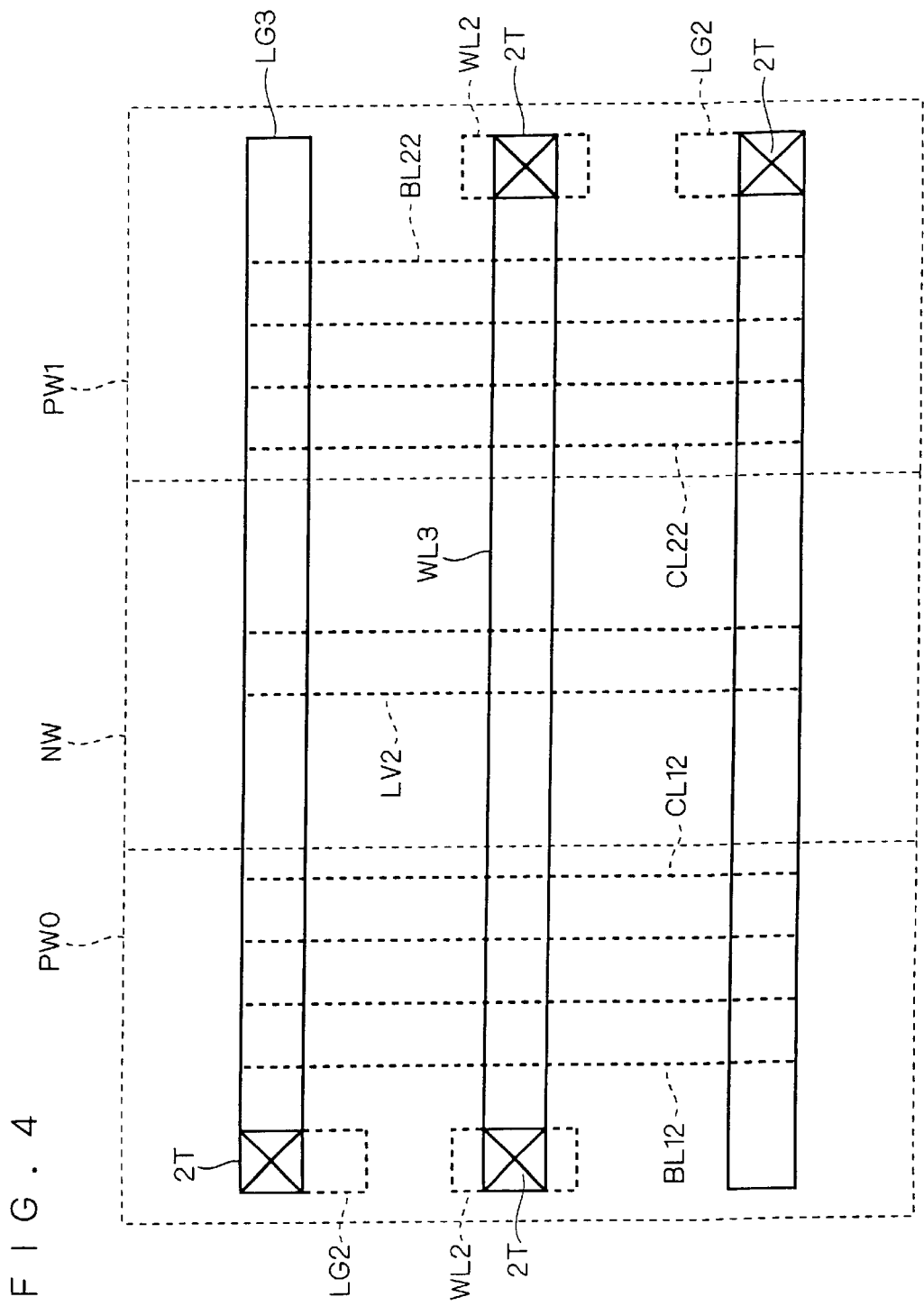
FIG. 4 is a view mainly illustrating a layout structure of a third aluminum wiring layer in FIG. 1, which is seen on a plane.

FIG. 1 is a view illustrating a layout structure of all layers of a memory cell in an SRAM according to a first embodiment of the present invention, which is seen on a plane. FIG. 2 is a view mainly illustrating a layout structure of a portion provided under a first aluminum wiring layer in FIG. 1, which is seen on a plane. FIG. 3 is a view mainly illustrating a layout structure of a second aluminum wiring layer in FIG. 1, which is seen on a plane. FIG. 4 is a view mainly illustrating a layout structure of a third aluminum wiring layer in FIG. 1, which is seen on a plane. More specifically, FIGS. 2 to 4 are supplementary views to FIG. 1, illustrating the layout structure shown in FIG. 1 which is divided every wiring layer for easy understanding. FIG. 5 is a circuit diagram showing an equivalent circuit of the memory cell according to the first embodiment illustrated in FIGS. 1 to 4. Some designations shown in FIGS. 2 to 4 are partially omitted in FIG. 1.

As shown in the equivalent circuit of FIG. 5, an NMOS transistor N1 and a PMOS transistor P1 constitute a first (CMOS) inverter and an NMOS transistor N2 and a PMOS transistor P2 constitute a second (CMOS) inverter. Output terminals of the first and second inverters are mutually connected to input terminals thereof, thereby constituting storage terminals Na and Nb.

An NMOS transistor N3 has a source connected to the storage terminal Na and a gate connected to a word line WL to be a row selection signal line. An NMOS transistor N4 has a gate connected to a column line CL1 to be a column selection signal line and a drain connected to a bit line BL1. A drain of the NMOS transistor N3 is connected to a source of the NMOS transistor N4.

Similarly, an NMOS transistor N5 has a source connected to the storage terminal Nb and a gate connected to the word line WL, an NMOS transistor N6 has a gate connected to a column line CL2 and a drain connected to a bit line BL2, and a drain of the NMOS transistor N5 is connected to a source of the NMOS transistor N6. The arrangement of a memory cell in a matrix shown in FIG. 5 constitutes an SRAM memory cell circuit of a low power consumption type in which a memory cell can be selected in a row direction through the word line WL and can be selected in a column direction through the column lines CL1 and CL2.

As shown in FIGS. 1 to 4, a P well region PW0 and a P well region PW1 are formed opposite to each other with an N well region NW interposed therebetween. The NMOS transistors N1, N3 and N4 are formed in the P well region PW0, the PMOS transistors P1 and P2 are formed in the N well region NW, and the NMOS transistors N2, N5 and N6 are formed in the P well region PW1. The PMOS transistors P1 and P2 and the NMOS transistors N1 and N2 serve as driver transistors and the NMOS transistors N3 to N6 serve as access transistors.

A portion in which a diffusion region FL shown in these drawings overlaps with a polysilicon wiring PL formed on the diffusion region FL serves as a transistor. A specific structure of the MOS transistor will be described below in detail.

In the P well region PW0, the NMOS transistor N1 is constituted by a polysilicon wiring PL1 and N-type diffusion regions FL200 and FL210, the NMOS transistor N3 is constituted by a polysilicon wiring PL3, the N-type diffusion region FL210 and an N-type diffusion region FL212, and the NMOS transistor N4 is constituted by a polysilicon wiring PL4, the N-type diffusion region FL212 and an N-type diffusion region FL220.

In the P well region PW1, the NMOS transistor N2 is constituted by a polysilicon wiring PL2 and N-type diffusion regions FL201 and FL211, the NMOS transistor N5 is constituted by a polysilicon wiring PL5, the N-type diffusion region FL211 and an N-type diffusion region FL213, and the NMOS transistor N6 is constituted by a polysilicon wiring PL6, the N-type diffusion region FL213 and an N-type diffusion region FL221.

In the N well region NW, the PMOS transistor P1 is constituted by the polysilicon wiring PL1 and P-type diffusion regions FL100 and FL110 and the PMOS transistor P2 is constituted by the polysilicon wiring PL2 and P-type diffusion regions FL101 and FL111.

Gates of the PMOS transistor P1 and the NMOS transistor N1 are formed by the common polysilicon wiring PL1, and the polysilicon wiring PL1 is electrically connected through a gate contact GC to an aluminum wiring AL21 to be the storage terminal Nb. Similarly, gates of the PMOS transistor P2 and the NMOS transistor N2 are formed by the common polysilicon wiring PL2, and the polysilicon wiring PL2 is electrically connected through the gate contact GC to an aluminum wiring AL11 to be the storage terminal Na.

In FIGS. 1 and 2, the P-type diffusion regions FL100, FL101, FL110 and FL111 in the N well region NW are formed by implanting a P-type impurity and the N-type diffusion regions FL200, FL201, FL210 to FL213, FL220 and FL221 in the P well regions PW0 and PW1 are formed by implanting an N-type impurity.

At least one diffusion contact hole IC is formed in each of the diffusion regions FL excluding the N-type diffusion regions FL212 and FL213, and the diffusion regions FL are electrically connected through the contact hole IC to a metal wiring of a first layer (a ground wiring LG1, a power wiring LV1, a word line WL1, bit lines BL11 and BL21, column lines CL11 and CL21, and the aluminum wirings AL11 and AL21). Specific connection contents will be described below in detail.

In the P well region PW0, the N-type diffusion region FL200 is electrically connected to the ground wiring LG1 through the contact hole 1C, the N-type diffusion region FL210 is electrically connected to the aluminum wiring AL11 through the contact hole 1C, and the N-type diffusion region FL220 is electrically connected to the bit line BL11 through the contact hole 1C.

In the P well region PW1, the N-type diffusion region FL201 is electrically connected to the ground wiring LG1 through the contact hole 1C, the N-type diffusion region FL211 is electrically connected to the aluminum wiring AL21 through the contact hole 1C, and the N-type diffusion region FL221 is electrically connected to the bit line BL21 through the contact hole 1C.

In the N well region NW, the P-type diffusion region FL100 is electrically connected to the power wiring LV1 through the contact hole 1C, the P-type diffusion region FL110 is electrically connected to the aluminum wiring AL11 through the contact hole 1C, the P-type diffusion region FL111 is electrically connected to the aluminum wiring AL21 through the contact hole 1C, and the P-type diffusion region FL101 is electrically connected to the power wiring LV1 through the contact hole 1C.

Moreover, at least one gate contact hole GC is formed in each of the polysilicon wirings PL1 to PL6, and the polysilicon wirings PL1 to PL6 are electrically connected to the metal wiring of the first layer through the gate contact GC. Specific connection contents will be described below in detail.

In the P-well region PW0, the polysilicon wiring PL3 is electrically connected to the word line WL1 through the gate contact GC and the polysilicon wiring PL4 is electrically connected to the column line CL11 through the gate contact GC.

In the P-well region PW1, the polysilicon wiring PL5 is electrically connected to the word line WL1 through the gate contact GC and the polysilicon wiring PL6 is electrically connected to the column line CL21 through the gate contact GC.

In the N-well region NW, the polysilicon wiring PL1 is electrically connected to the aluminum wiring AL21 through the gate contact GC and the polysilicon wiring PL2 is electrically connected to the aluminum wiring AL11 through the gate contact GC.

Accordingly, the N-type diffusion region FL210 of the NMOS transistor N1 and the P-type diffusion region FL110 of the PMOS transistor P1 are electrically connected to each other with a low impedance through the contact hole 1C and the aluminum wiring AL11 to be the metal wiring of the first layer, and are electrically connected with a low impedance to the polysilicon wiring PL2 through the gate contact GC. This portion corresponds to the storage terminal Na shown in the equivalent circuit diagram of FIG. 5.

Similarly, the N-type diffusion region FL211 of the NMOS transistor N2 and the P-type diffusion region FL111 of the PMOS transistor P2 are electrically connected to each other with a low impedance through the contact hole 1C and the aluminum wiring AL21 to be the metal wiring of the first layer, and are electrically connected with a low impedance to the polysilicon wiring PL1 through the gate contact GC. This portion corresponds to the storage terminal Nb shown in the equivalent circuit diagram of FIG. 5.

Next, the electrical connection relationship shown in FIGS. 2 and 3 will be described. In the P well region PW0, a ground wiring LG2 to be a metal wiring of a second layer is electrically connected to the ground wiring LG1 through a via hole 1T, a word line WL2 to be the metal wiring of the second layer is electrically connected to the word line WL1 through the via hole 1T, a bit line BL12 to be the metal wiring of the second layer is electrically connected to the bit line BL11 through the via hole 1T, and a column line CL12 to be the metal wiring of the second layer is electrically connected to the column line CL11 through the via hole 1T.

In the P well region PW1, the ground wiring LG2 is electrically connected to the ground wiring LG1 through the via hole 1T, the word line WL2 is electrically connected to the word line WL1 through the via hole 1T, a bit line BL22 to be the metal wiring of the second layer is electrically connected to the bit line BL21 through the via hole 1T, and a column line CL22 to be the metal wiring of the second layer is electrically connected to the column line CL21 through the via hole 1T.

In the N well region NW, a power wiring LV2 is electrically connected to two power wirings LV1 through the via holes 1T in two places.

Subsequently, the electrical connection relationship shown in FIG. 4 will be described. In the P well region PW0, a ground wiring LG3 to be a metal wiring of a third layer is electrically connected to the ground wiring LG2 through a via hole 2T and a word line WL3 to be the metal wiring of the third layer is electrically connected to the word line WL2 through the via hole 2T.

In the P well region PW1, the ground wiring LG3 is electrically connected to the ground wiring LG2 through the via hole 2T and the word line WL3 is electrically connected to the word line WL2 through the via hole 2T.

The relationship between the layout structures shown in FIGS. 1 to 4 and the equivalent circuit of FIG. 5 will be described below.

The P-type diffusion regions FL100 and FL101 of the PMOS transistors P1 and P2 are set to have a power potential VDD through the power wiring LV1 and the power wiring LV2 which is electrically connected through the via hole 1T, respectively. More specifically, the P-type diffusion regions FL100 and FL101 correspond to the sources of the PMOS transistors P1 and P2 in FIG. 5.

Moreover, the N-type diffusion regions FL200 and FL201 are set to have a ground potential GND through the contact hole 1C, the ground wiring LG1, the via hole 1T, the ground wiring LG2 and the ground wiring LG3 which is electrically connected through the via hole 2T, respectively. More specifically, the N-type diffusion regions FL200 and FL201 correspond to the sources of the NMOS transistors N1 and N2 in FIG. 5.

The N-type diffusion region FL220 to be the drain of the NMOS transistor N4 is electrically connected to the bit line BL12 (corresponding to the BL1 in FIG. 5) through the contact hole 1C, the bit line BL11 and the via hole 1T.

Similarly, the N-type diffusion region FL221 to be the drain of the NMOS transistor N6 is electrically connected to the bit line BL22 (corresponding to the BL2 in FIG. 5) through the contact hole 1C, the bit line BL21 and the via hole 1T.

Moreover, the polysilicon wiring PL4 to be the gate of the NMOS transistor N4 is electrically connected to the column line CL12 (corresponding to the column line CL1 in FIG. 5) through the gate contact GC, the column line CL11 and the via hole 1T. Similarly, the polysilicon wiring PL6 to be the gate of the NMOS transistor N6 is electrically connected to the column line CL22 (corresponding to the column line CL12 in FIG. 5) through the gate contact GC, the column line CL21 and the via hole 1T.

The polysilicon wiring PL3 to be the gate of the NMOS transistor N3 is electrically connected to the word line WL3 (corresponding to the word line WL in FIG. 5) through the gate contact GC, the word line WL1, the via hole 1T, the word line WL2 and the via hole 2T. Similarly, the polysilicon wiring PL5 to be the gate of the NMOS transistor N5 is electrically connected to the word line WL3 through the gate contact GC, the word line WL1, the via hole 1T, the word line WL2 and the via hole 2T.

As shown in FIGS. 1 to 4, the NMOS transistors N1, N3 and N4 are formed in the P well region PW0, the NMOS transistors N2, N5 and N6 are formed in the P well region PW1, and a wiring direction (a longitudinal direction in FIGS. 1 to 4; a second direction) of the bit lines BL1 and BL2 (the bit lines BL12 and BL22 in FIGS. 1 and 3) is set to be orthogonal to a direction of separation arrangement of the P well regions PW0 and PW1 (a transverse direction in FIGS. 1 to 4; a first direction) so that wiring lengths of the bit lines BL1 and BL2 (lengths in a wiring direction) are not influenced by the number of the NMOS transistors to be formed in the P well regions PW0 and PW1. Therefore, the wiring length of the bit line can be reduced as compared with a conventional memory cell of a low power consumption type which uses a column line. As a result, an access time can be shortened.

By setting the wiring directions of the column lines CL1 and CL2 (the column lines CL12 and CL22 in FIG. 3) to be orthogonal to the direction of the separation arrangement of the P well regions PW0 and PW1, moreover, the wiring lengths of the column lines CL1 and CL2 can be reduced in the same manner as the bit lines BL1 and BL2. Furthermore, the word line WL (WL1 to WL3) is arranged in parallel with the direction of the separation arrangement of the P well regions PW0 and PW1 so that a positional relationship on a layout orthogonal to the bit lines BL1 and BL2 can be maintained to be excellent.

By forming the NMOS transistors N1, N3 and N4 in the P well region PW0 and the NMOS transistors N2, N5 and N6 in the P well region PW1, moreover, it is possible to implement a layout structure in which three adjacent NMOS transistors share the diffusion region FL to be the source or the drain. As a result, the degree of integration can be enhanced. In addition, by arranging the NMOS transistors N1, N3 and N4 and the NMOS transistors N2, N5 and N6 on an almost straight line, a wasteful region can be reduced and the degree of integration can be enhanced.

Moreover, the directions of formation of the polysilicon wirings PL1 to PL6 are identical to each other. Therefore, a gate dimension can easily be controlled. In addition, the polysilicon wirings PL1 and PL6 (the MOS transistors N1, P1 and N6), the polysilicon wirings PL3 and PL5 (the NMOS transistors N3 and N5) and the polysilicon wirings PL2 and PL4 (the MOS transistors N2, P2 and N4) are arranged on a straight line, respectively. Consequently, a wasteful region can be prevented from being generated with the formation of the polysilicon wiring PL and an area can be reduced.

While BL11 and BL21 have been shown as the bit lines in FIGS. 1 to 4 for convenience of the description, the bit lines BL12 and BL22 correspond to original bit lines and the bit lines BL11 and BL21 are metal wirings to be provided intermediately. Similarly, the word lines WL1 and WL2, the column lines CL11 and CL21, the power wiring LV1 and the ground wirings LG1 and LG2 are metal wirings to be provided intermediately for electrical connection to the word line WL3, the column lines CL12 and CL22, the power wiring LV2 and the ground wiring LG3.

Second Embodiment

Figure 6:
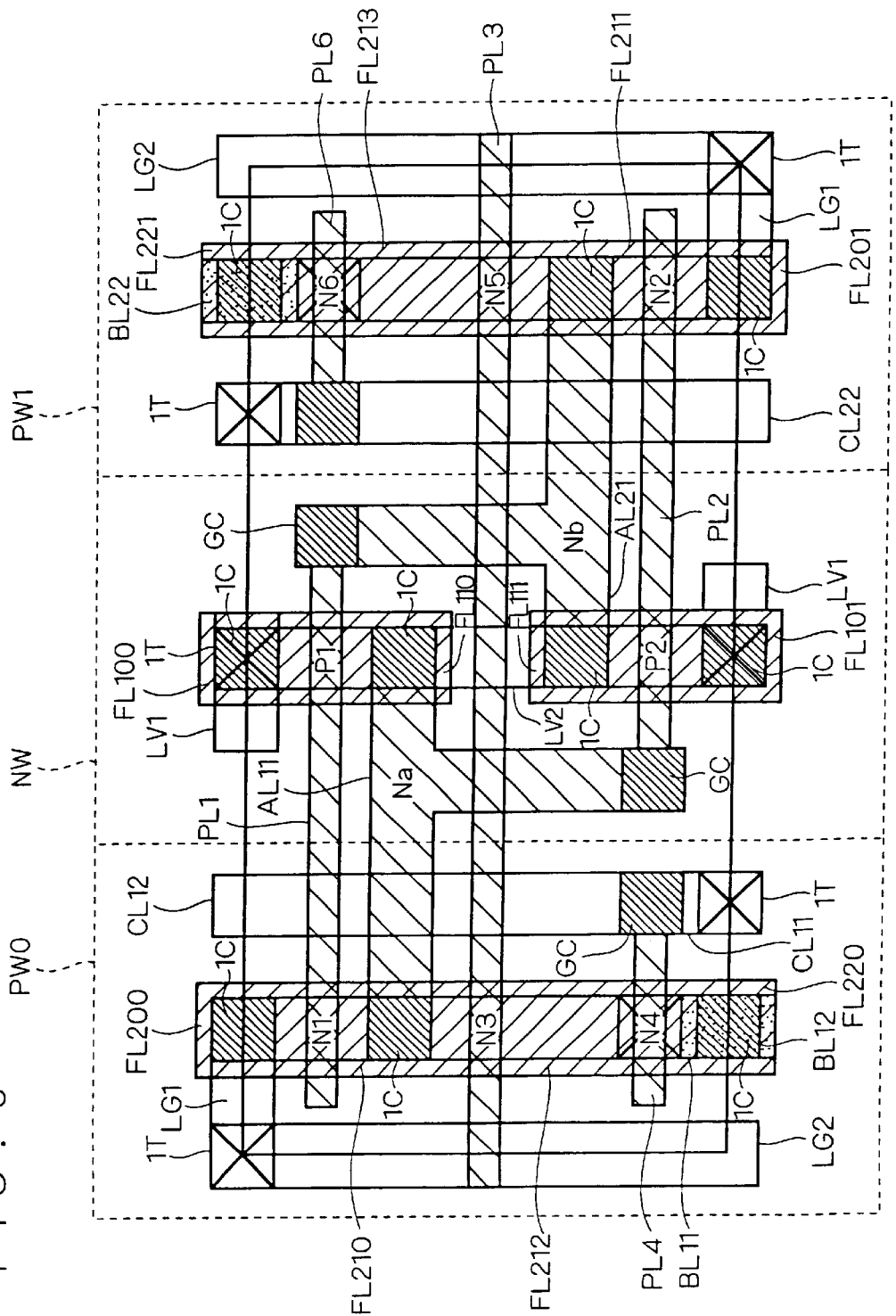
FIG. 6 is a view illustrating a layout structure of all layers of a memory cell in an SRAM according to a second embodiment of the present invention, which is seen on a plane.
Figure 7:
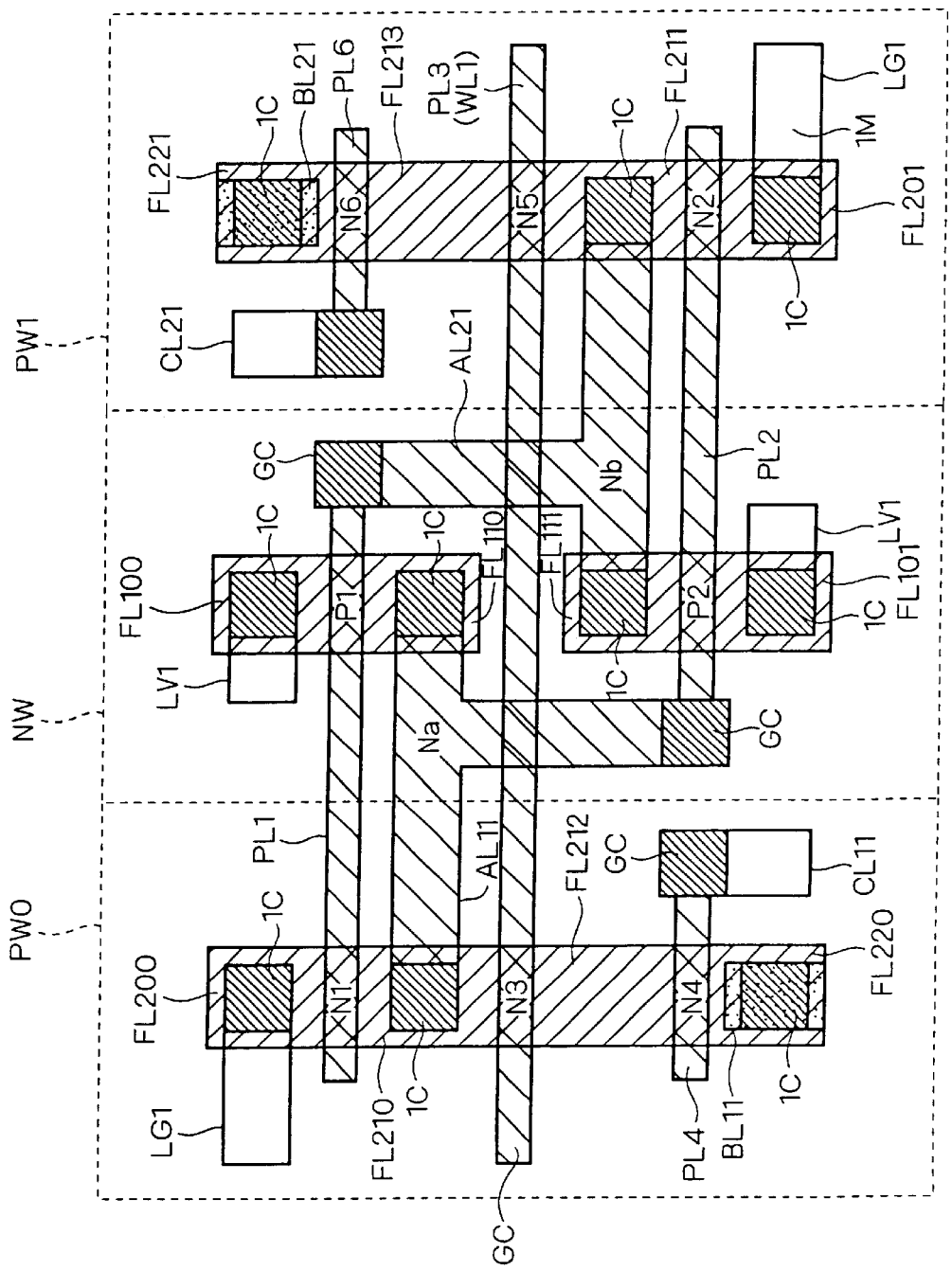
FIG. 7 is a view mainly illustrating a layout structure of a portion provided under a first aluminum wiring layer in FIG. 6, which is seen on a plane.
Figure 8:
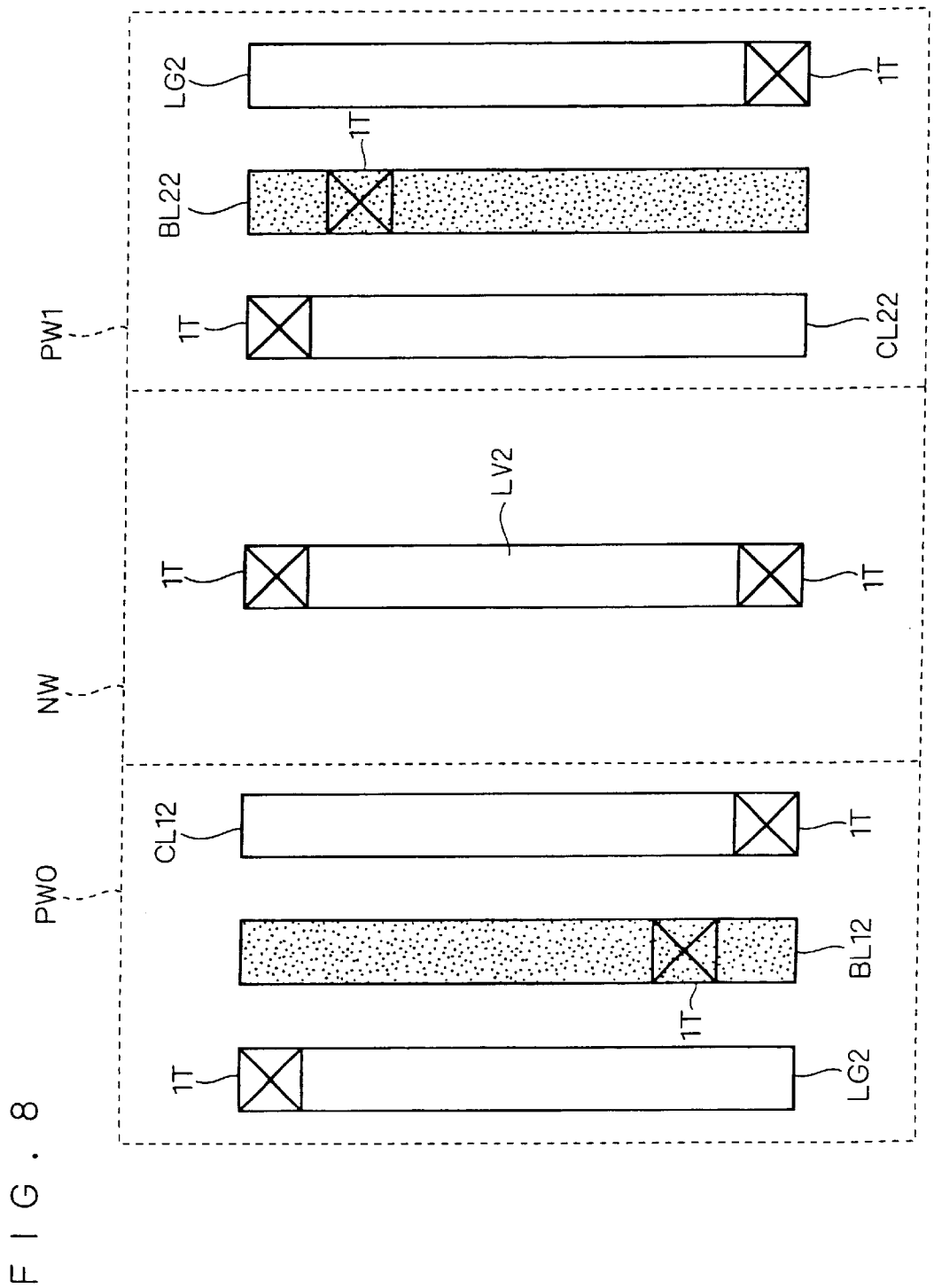
FIG. 8 is a view mainly illustrating a layout structure of a second aluminum wiring layer in FIG. 6, which is seen on a plane.

FIG. 6 is a view illustrating a layout structure of all layers of a memory cell in an SRAM according to a second embodiment of the present invention, which is seen on a plane. FIG. 7 is a view mainly illustrating a layout structure of a portion provided under a first aluminum wiring layer in FIG. 6, which is seen on a plane. FIG. 8 is a view mainly illustrating a layout structure of a second aluminum wiring layer in FIG. 6, which is seen on a plane. More specifically, FIGS. 7 and 8 are supplementary views to FIG. 6, illustrating the layout structure shown in FIG. 6 which is divided every wiring layer for easy understanding. Some designations shown in FIGS. 7 and 8 are partially omitted in FIG. 6. Moreover, equivalent circuit diagrams of the memory cell according to the second embodiment shown in FIGS. 6 to 8 are the same as those in the first embodiment shown in FIG. 5.

A difference from the first embodiment will be described below. As shown in FIGS. 6 to 8, NMOS transistors N3 and N5 are connected to each other through a common polysilicon wiring PL3 and are thus used as a word line WL. As a result, the word lines WL1 to WL3 to be the metal wirings of the first to third layers which have been used in the first embodiment are not required.

In addition, N-type diffusion regions FL200 and FL201 of NMOS transistors N1 and N2 are electrically connected to a ground wiring LG2 through a contact hole 1C, a ground wiring LG1 and a via hole 1T respectively and are thereby set to have a ground potential GND. As a result, the ground wiring LG3 to be the metal wiring of the third layer which has been used in the first embodiment is not required.

Since other structures are the same as those in the first embodiment shown in FIGS. 1 to 4, description will be omitted (the same portions as those in the first embodiment have the same designations).

With a layout structure according to the second embodiment, thus, the common word line (gate) of the NMOS transistors N3 and N5 is constituted by the polysilicon wiring PL3. Consequently, the word line WL3 and the ground wiring LG3 are not required. Thus, any metal wiring of the third layer does not need to be formed and a layout can be implemented with a small number of wiring layers (only the first and second layers). In addition to the effects of the first embodiment, therefore, the second embodiment can produce effects that a cost can be reduced, a process term can be shortened and yield can be enhanced.

Third Embodiment

Figure 9:
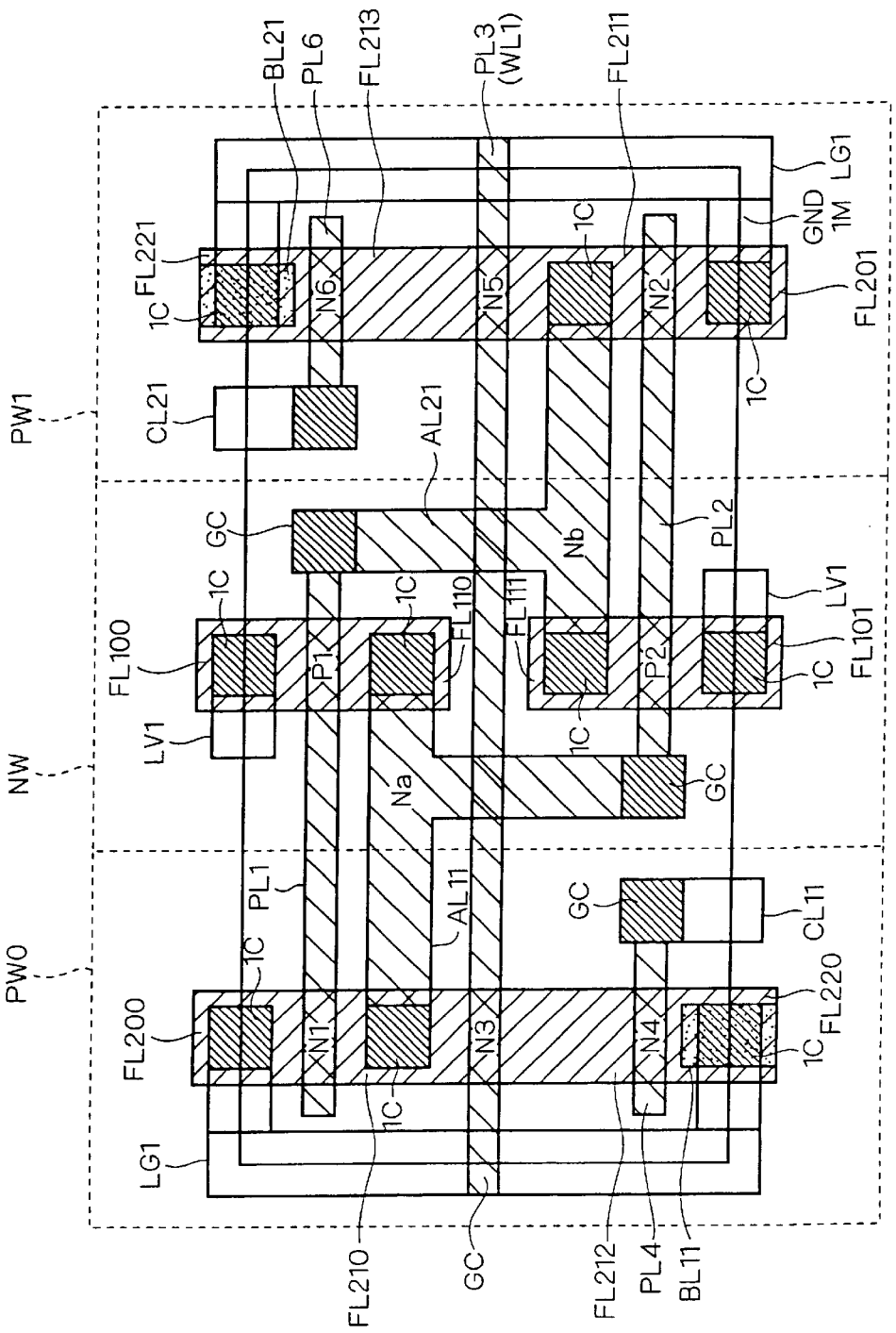
FIG. 9 is a view illustrating a layout structure of all layers of a memory cell in an SRAM according to a third embodiment of the present invention, which is seen on a plane.
Figure 10:
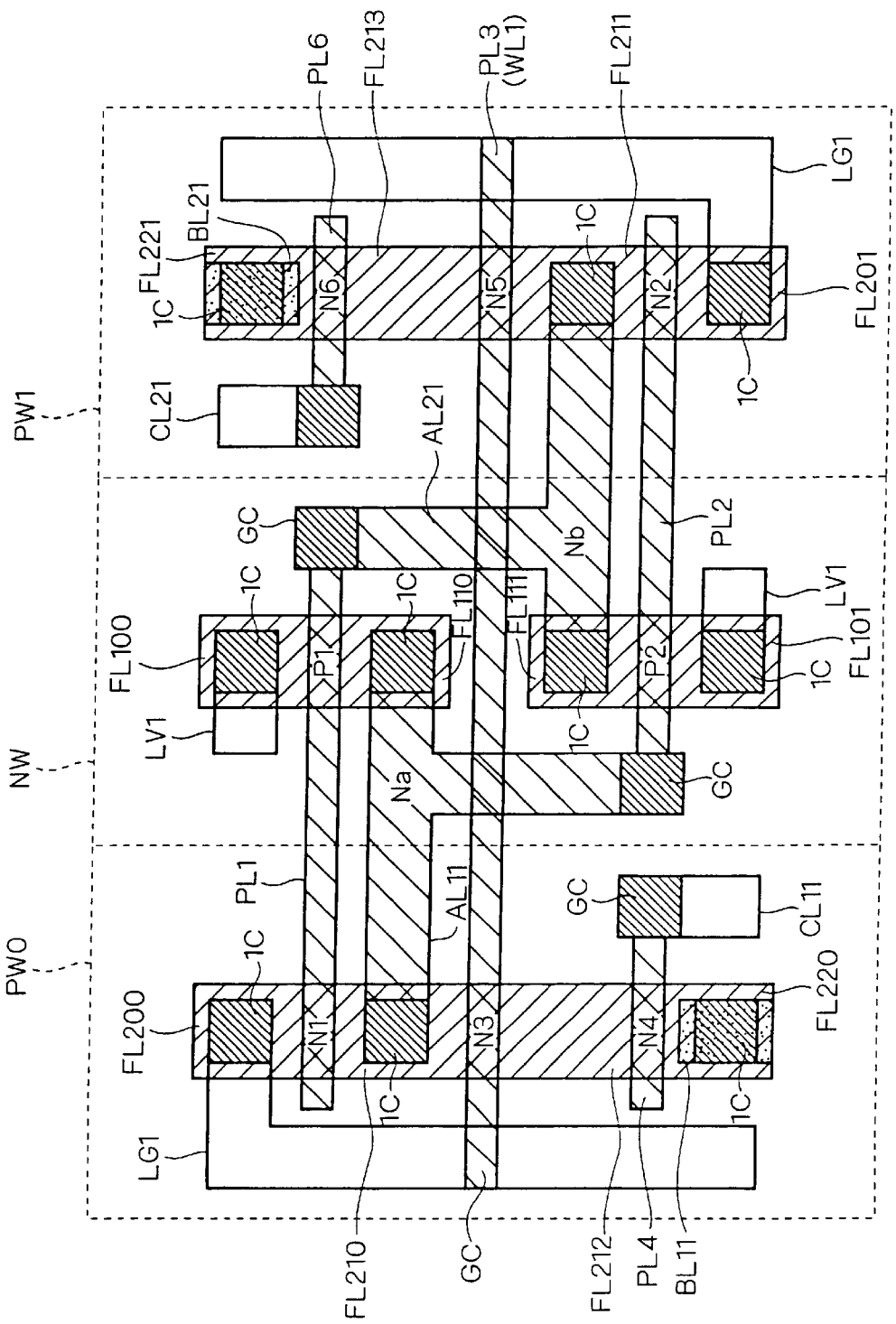
FIG. 10 is a view mainly illustrating a layout structure of a portion provided under a first aluminum wiring layer in FIG. 9, which is seen on a plane.
Figure 11:
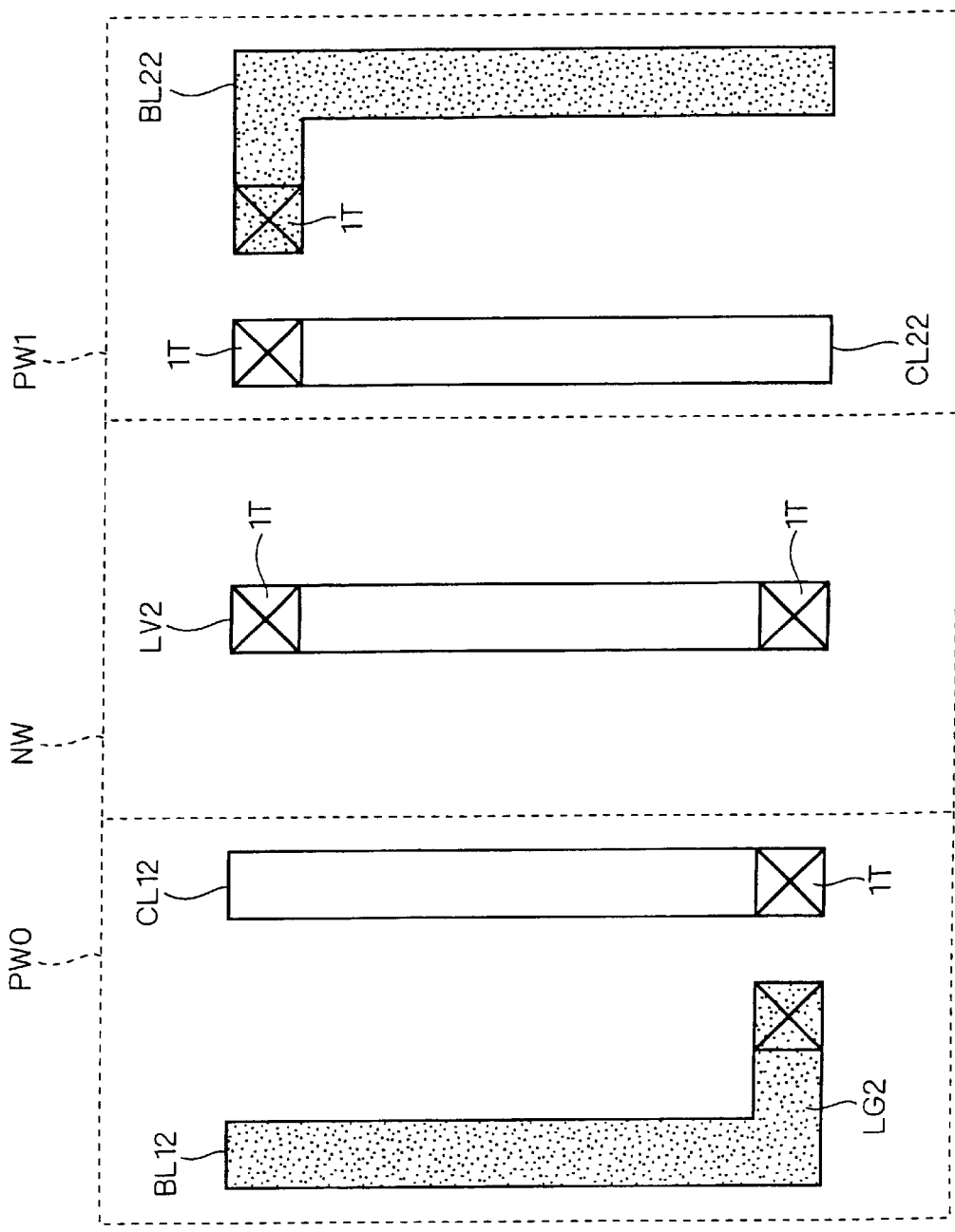
FIG. 11 is a view mainly illustrating a layout structure of a second aluminum wiring layer in FIG. 9, which is seen on a plane.

FIG. 9 is a view illustrating a layout structure of all layers of a memory cell in an SRAM according to a third embodiment of the present invention, which is seen on a plane. FIG. 10 is a view mainly illustrating a layout structure of a portion provided under a first aluminum wiring layer in FIG. 9, which is seen on a plane. FIG. 11 is a view mainly illustrating a layout structure of a second aluminum wiring layer in FIG. 9, which is seen on a plane. More specifically, FIGS. 10 and 11 are supplementary views to FIG. 9, illustrating the layout structure shown in FIG. 9 which is divided every wiring layer for easy understanding. Some designations shown in FIGS. 10 and 11 are partially omitted in FIG. 9. Moreover, equivalent circuit diagrams of the memory cell according to the third embodiment shown in FIGS. 9 to 11 are the same as those in the first embodiment shown in FIG. 5.

A difference from the second embodiment will be described below. An N-type diffusion region FL210 is electrically connected to the aluminum wiring AL11 through a contact hole 1C. Two ground wirings LG1 are provided in parallel with a direction of formation of diffusion regions (FL200, FL210, FL212 and FL220) of NMOS transistors N1, N3 and N4 and a direction of formation of diffusion regions (FL201, FL211, FL213 and FL221) of NMOS transistors N2, N5 and N6 so that the ground wirings LG1 can be set to have a ground potential GND.

As a result, it is not necessary to provide the ground wiring LG3 to be the metal wiring of the third layer which has been used in the first embodiment and the ground wiring LG2 to be the metal wiring of the second layer which has been used in the second embodiment.

Moreover, a bit line BL12 is electrically connected to a bit line BL11 through a via hole 1T and a bit line BL22 is electrically connected to a bit line BL21 through the via hole 1T.

Figure 12:
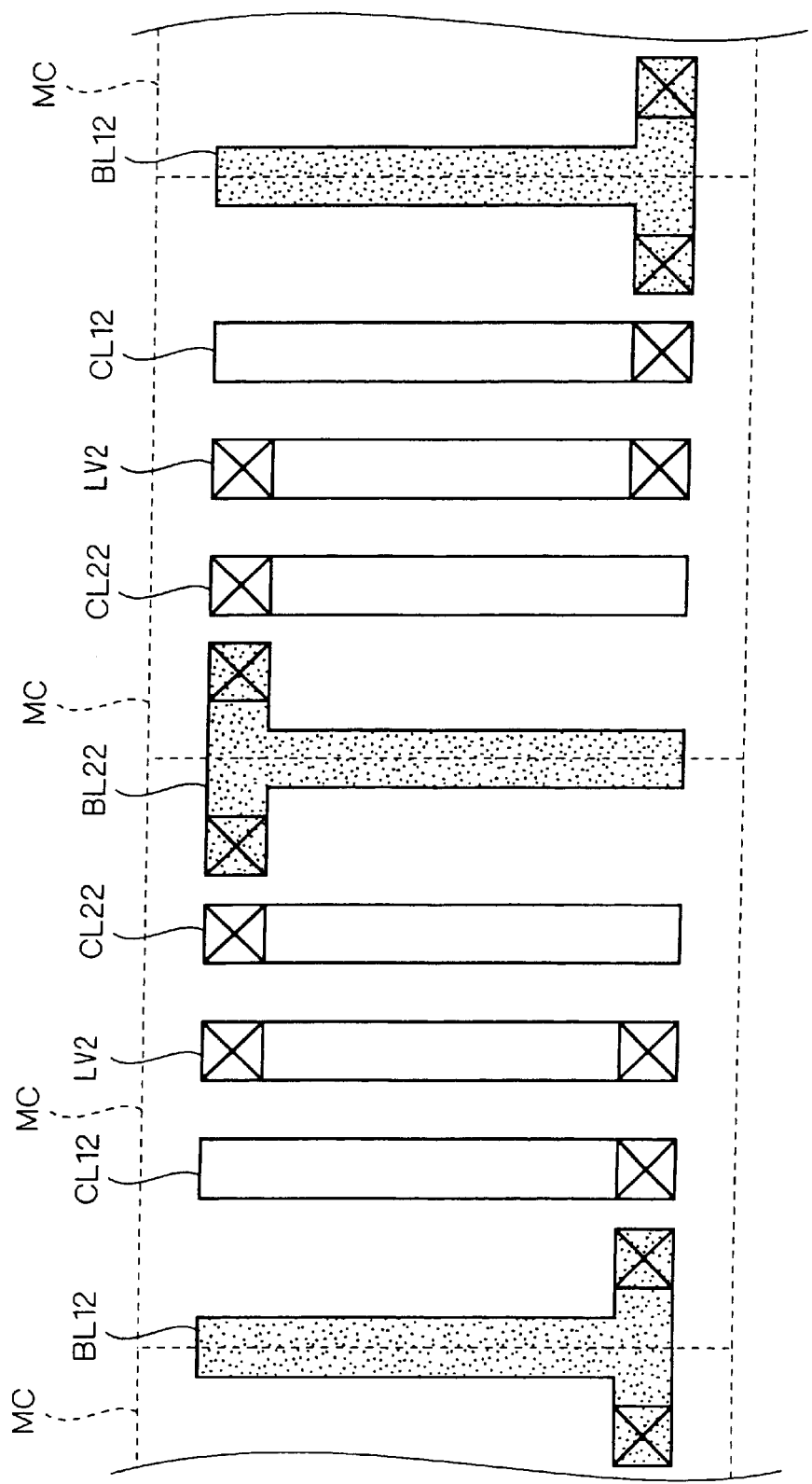
FIG. 12 is a view illustrating a layout structure between adjacent memory cells according to the third embodiment.

FIG. 12 is a view illustrating a layout structure between adjacent memory cells. As shown in FIG. 12, the bit lines BL12 and BL22 are shared by adjacent memory cells MC and MC, respectively. Other structures are the same as those in the second embodiment.

Thus, the bit line can be shared by the adjacent memory cells in the layout structure according to the third embodiment. In addition to the effects according to the second embodiment, therefore, the following effects can be produced.

In the case in which a memory cell formation region is identical, wiring intervals between a bit line BL1 and a column line CL1 and between a bit line BL2 and a column line CL2 can be made greater than those of the second embodiment. As a result, a wiring capacity can be reduced with an increase in the wiring interval. Consequently, a reduction in a bit line capacity can produce an increase in a speed. In addition, since the wiring interval is increased, it is possible to improve a deterioration in yield caused by foreign matters in a wafer process or the like.

Fourth Embodiment

Figure 13:
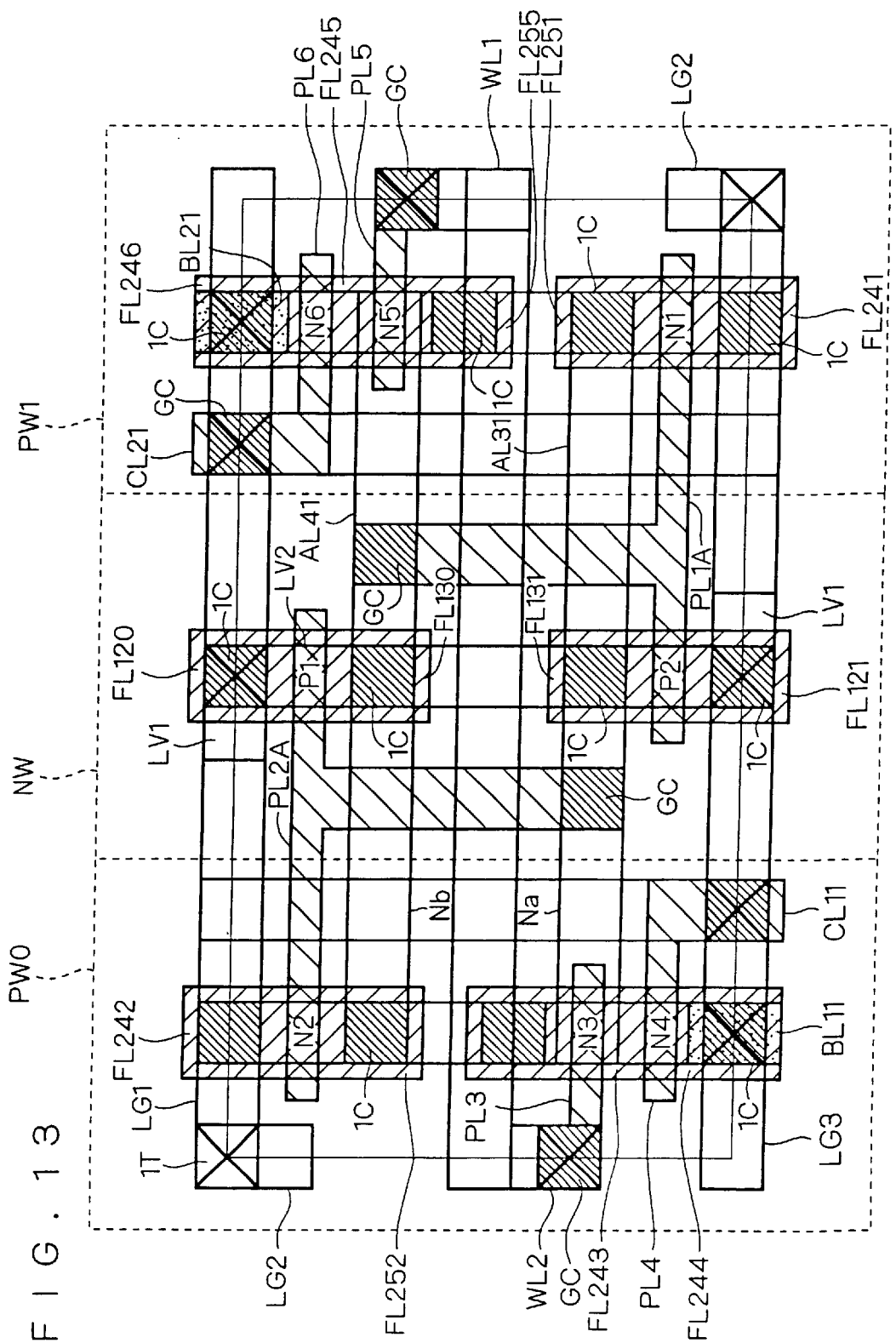
FIG. 13 is a view illustrating a layout structure of all layers of a memory cell in an SRAM according to a fourth embodiment of the present invention, which is seen on a plane.
Figure 14:
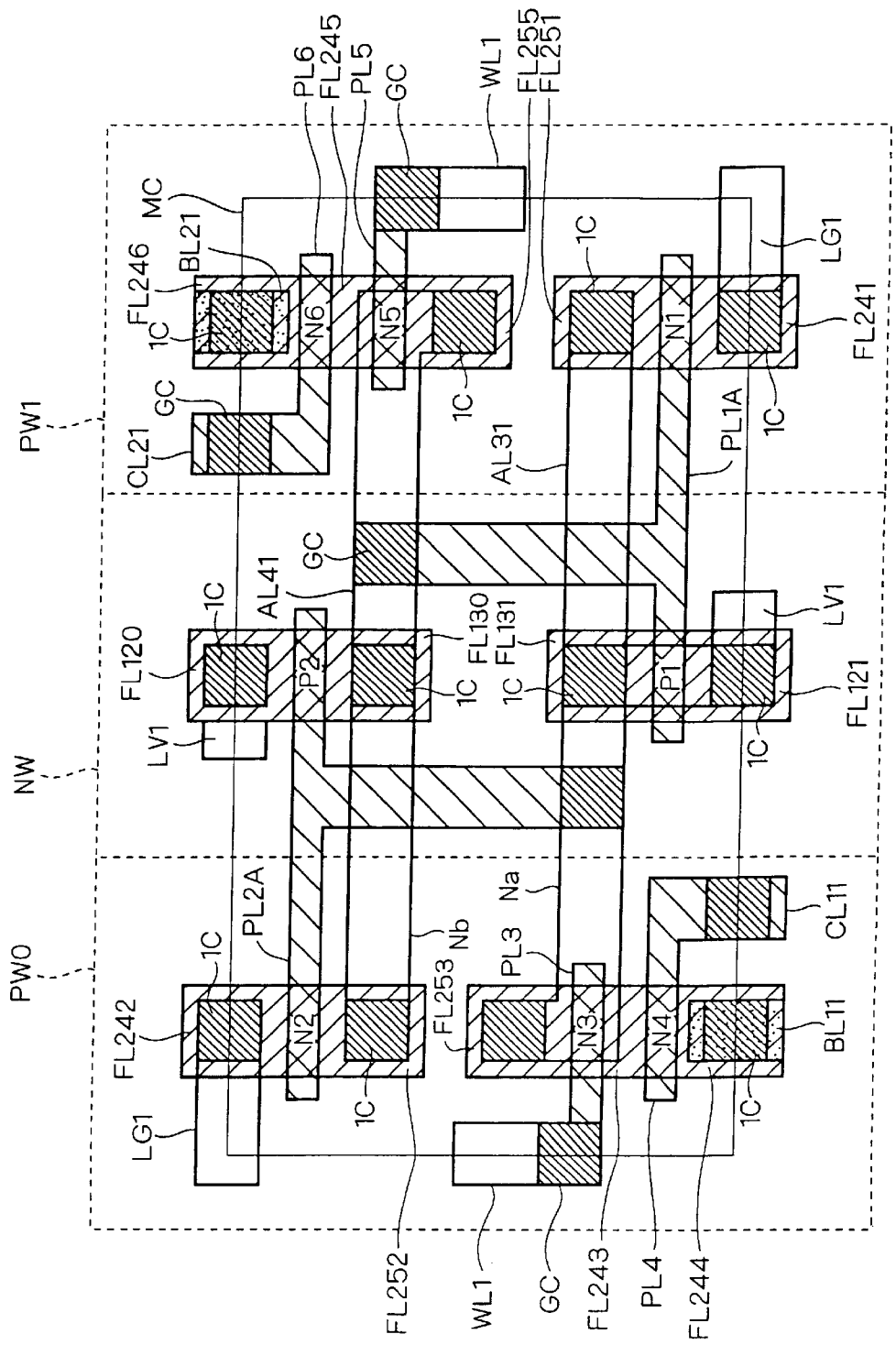
FIG. 14 is a view mainly illustrating a layout structure of a portion provided under a first aluminum wiring layer in FIG. 13, which is seen on a plane.
Figure 15:
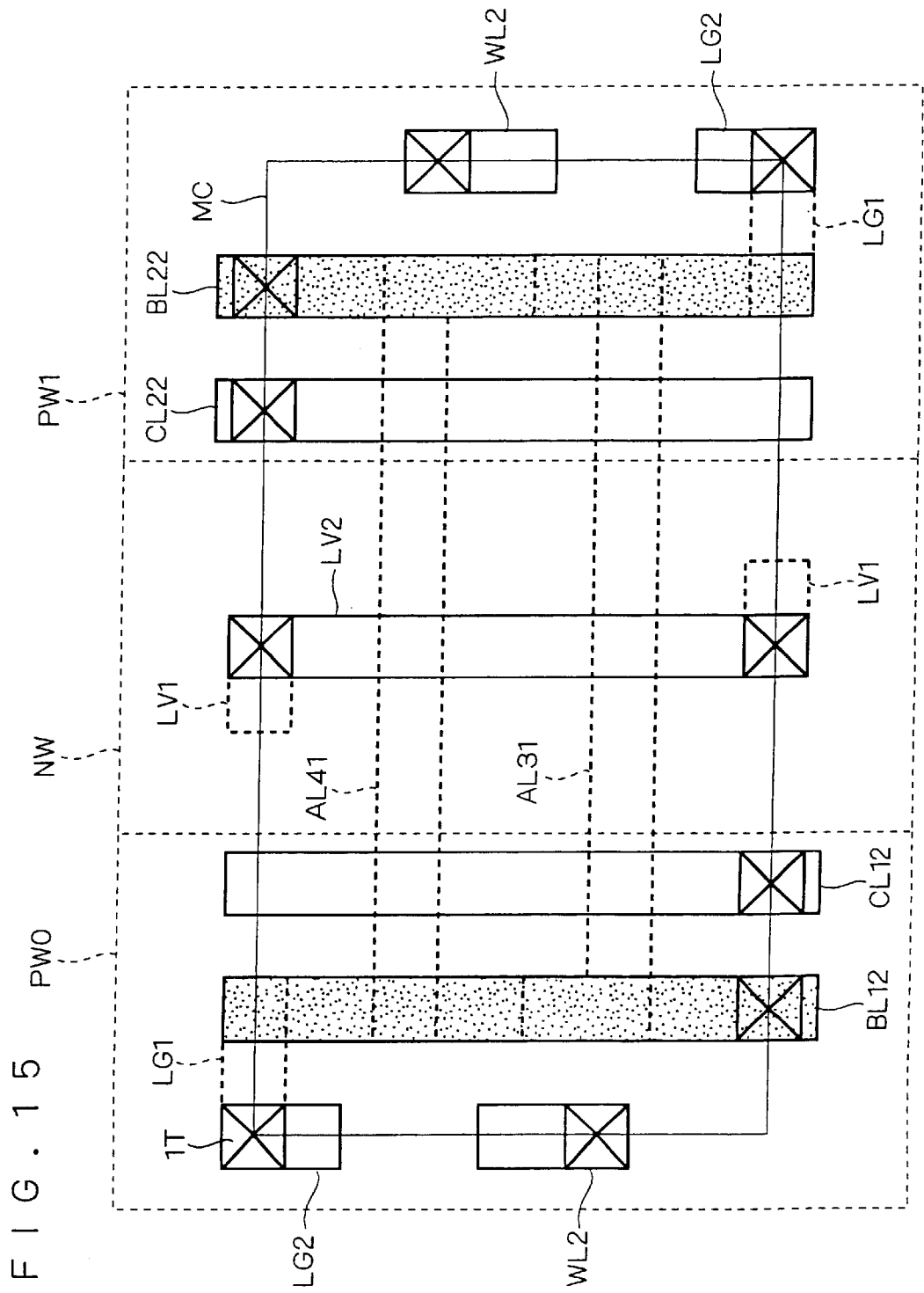
FIG. 15 is a view mainly illustrating a layout structure of a second aluminum wiring layer in FIG. 13, which is seen on a plane.
Figure 16:
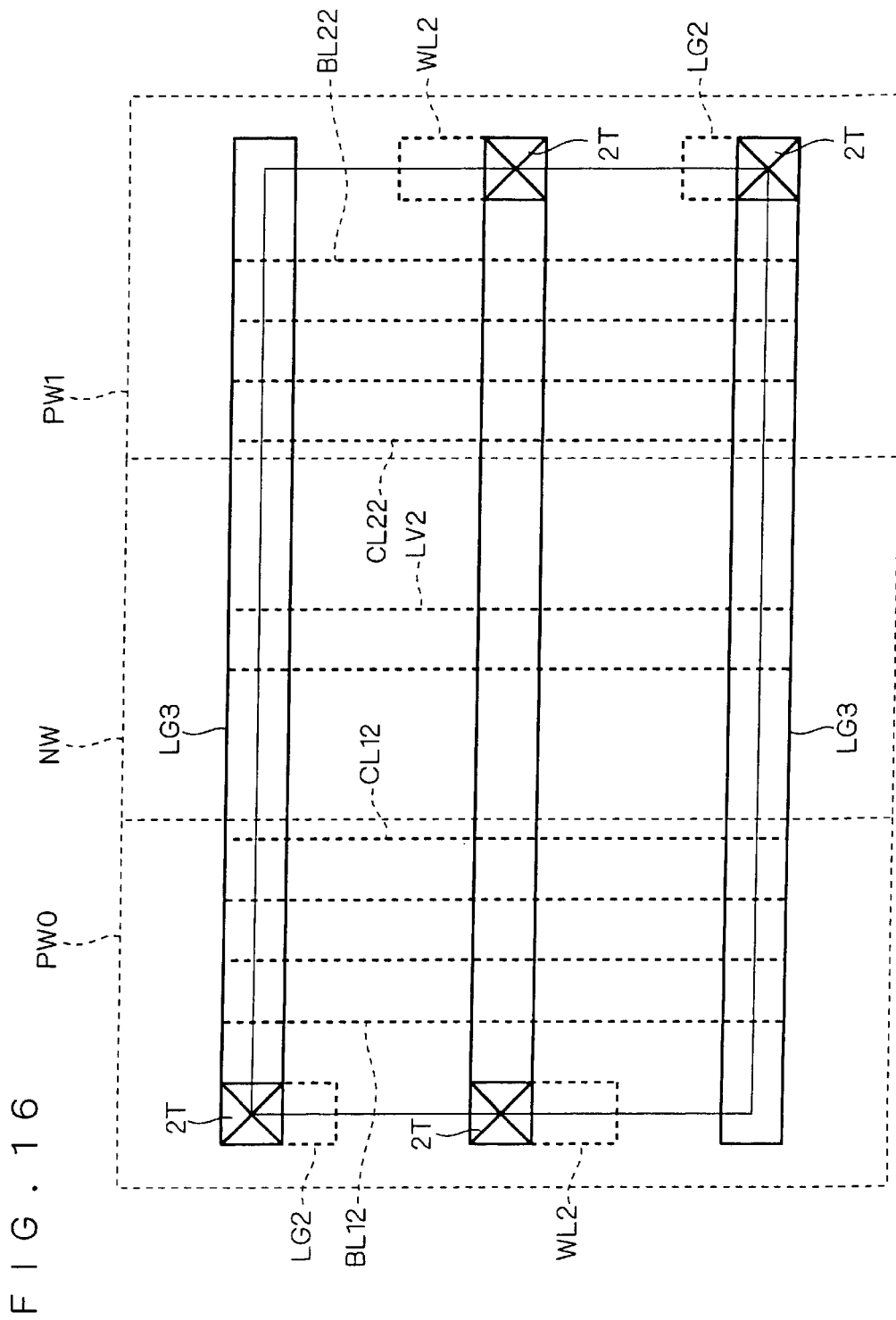
FIG. 16 is a view mainly illustrating a layout structure of a third aluminum wiring layer in FIG. 13, which is seen on a plane.

FIG. 13 is a view illustrating a layout structure of all layers of a memory cell in an SRAM according to a fourth embodiment of the present invention, which is seen on a plane. FIG. 14 is a view mainly illustrating a layout structure of a portion provided under a first aluminum wiring layer in FIG. 13, which is seen on a plane. FIG. 15 is a view mainly illustrating a layout structure of a second aluminum wiring layer in FIG. 13, which is seen on a plane. FIG. 16 is a view mainly illustrating a layout structure of a third aluminum wiring layer in FIG. 13, which is seen on a plane. More specifically, FIGS. 14 to 16 are supplementary views to FIG. 13, illustrating the layout structure shown in FIG. 13 which is divided every wiring layer for easy understanding. Some designations shown in FIGS. 14 to 16 are partially omitted in FIG. 13. Moreover, equivalent circuit diagrams of the memory cell according to the fourth embodiment shown in FIGS. 13 to 16 are the same as those in the first embodiment shown in FIG. 5.

As shown in FIGS. 13 to 16, NMOS transistors N2, N3 and N4 are formed in a P well region PW0, PMOS transistors P1 and P2 are formed in an N well region NW, and NMOS transistors N1, N5 and N6 are formed in a P well region PW1. A specific structure of the MOS transistor will be described below in detail.

In the P well region PW0, the NMOS transistor N2 is constituted by a polysilicon wiring PL1A and N-type diffusion regions FL242 and FL252, the NMOS transistor N3 is constituted by a polysilicon wiring PL3 and N-type diffusion regions FL253 and FL243, and the NMOS transistor N4 is constituted by a polysilicon wiring PL4, the N-type diffusion region FL243 and an N-type diffusion region FL244.

In the P well region PW1, the NMOS transistor N1 is constituted by a polysilicon wiring PL2A and N-type diffusion regions FL241 and FL251, the NMOS transistor N5 is constituted by a polysilicon wiring PL5 and N-type diffusion regions FL255 and FL245, and the NMOS transistor N6 is constituted by a polysilicon wiring PL6, the N-type diffusion region FL245 and an N-type diffusion region FL246.

In the N well region NW, the PMOS transistor P2 is constituted by the polysilicon wiring PL2A and P-type diffusion regions FL120 and FL130 and the PMOS transistor P1 is constituted by the polysilicon wiring PL1A and P-type diffusion regions FL121 and FL131.

Gates of the PMOS transistor P1 and the NMOS transistor N1 are formed by the common polysilicon wiring PL1A, and the polysilicon wiring PL1A is electrically connected through a gate contact GC to an aluminum wiring AL41 to be a storage terminal Nb. Similarly, gates of the PMOS transistor P2 and the NMOS transistor N2 are formed by the common polysilicon wiring PL2A, and the polysilicon wiring PL2A is electrically connected through the gate contact GC to an aluminum wiring AL31 to be a storage terminal Na.

The aluminum wiring AL31 to be the storage terminal Na is electrically connected to the polysilicon wiring PL2A through the gate contact GC and is electrically connected through a contact hole 1C to the N-type diffusion regions FL251 and FL253 and the P-type diffusion region FL131 of the NMOS transistors Ni and N3 and the PMOS transistor P1.

The aluminum wiring AL41 to be the storage terminal Nb is electrically connected to the polysilicon wiring PL1A through the gate contact GC and is electrically connected through the contact hole 1C to the N-type diffusion regions FL252 and FL255 and the P-type diffusion region FL130 of the NMOS transistors N2 and N5 and the PMOS transistor P2.

The relationship between the layout structures shown in FIGS. 13 to 16 and the equivalent circuit of FIG. 5 will be described below.

The P-type diffusion regions FL120 and FL121 of the PMOS transistors P2 and P1 are set to have a power potential VDD through the contact hole 1C, a power wiring LV1 and a power wiring LV2 which is electrically connected through the via hole 1T, respectively. More specifically, the P-type diffusion regions FL120 and FL121 correspond to the sources of the PMOS transistors P1 and P2 in FIG. 5.

Moreover, the N-type diffusion regions FL242 and FL241 of the NMOS transistors N2 and N1 are set to have a ground potential GND through the contact hole 1C, a ground wiring LG1, the via hole 1T, a ground wiring LG2 and a ground wiring LG3 which is electrically connected through a via hole 2T, respectively. More specifically, the N-type diffusion regions FL242 and FL201 correspond to the sources of the NMOS transistors N2 and N1 in FIG. 5.

The N-type diffusion region FL244 to be the drain of the NMOS transistor N4 is electrically connected to a bit line BL12 (corresponding to the BL1 in FIG. 5) through the contact hole 1C, a bit line BL1 and the via hole 1T.

Similarly, the N-type diffusion region FL246 to be the drain of the NMOS transistor N6 is electrically connected to a bit line BL22 (corresponding to the BL2 in FIG. 5) through the contact hole 1C, a bit line BL21 and the via hole 1T.

Moreover, the polysilicon wiring PL4 to be the gate of the NMOS transistor N4 is electrically connected to a column line CL12 (corresponding to the column line CL1 in FIG. 5) through the gate contact GC, a column line CL11 and the via hole 1T. Similarly, the polysilicon wiring PL6 to be the gate of the NMOS transistor N6 is electrically connected to a column line CL22 (corresponding to the column line CL2 in FIG. 5) through the gate contact GC, a column line CL21 and the via hole 1T.

The polysilicon wiring PL3 to be the gate of the NMOS transistor N3 is electrically connected to a word line WL3 (corresponding to the word line WL in FIG. 5) through the gate contact GC, a word line WL1, the via hole 1T, a word line WL2 and the via hole 2T. Similarly, the polysilicon wiring PL5 to be the gate of the NMOS transistor N5 is electrically connected to the word line WL3 through the gate contact GC, the word line WL1, the via hole 1T, the word line WL2 and the via hole 2T.

In the fourth embodiment, the N-type diffusion region to be electrically connected to the aluminum wiring AL31 to be the storage terminal Na is separately formed into the P well region PW0 (the N-type diffusion region FL253) and the P well region PW1 (the N-type diffusion region FL251). Similarly, the N-type diffusion region to be electrically connected to the aluminum wiring AL41 to be the storage terminal Nb is separately formed into the P well region PW0 (the N-type diffusion region FL252) and the P well region PW1 (the N-type diffusion region FL255).

As a result, in the case in which electrons generated by α rays or neutron rays are collected into the N-type diffusion region formed in one of the P well regions PW0 and PW1, the electrons are discharged from the N-type diffusion region formed in the other P well region in which the influence of the generation of the electrons is prevented by the provision of the N well region NW. For example, the electrons collected into the N-type diffusion region FL252 of the P well region PW0 are discharged from the N-type diffusion region FL255 of the P well region PW1 through the storage terminal Nb so that the influence on a depletion region in the P well region PW0 can be reduced. Similarly, the electrons collected into the N-type diffusion region FL251 of the P well region PW1 are discharged from the N-type diffusion region FL253 of the P well region PW0 through the storage terminal Na so that the influence on a depletion region in the P well region PW1 can be reduced.

By such an operation, the generation of electrons to invert data held in the storage terminals Na and Nb is offset. Consequently, the data are inverted with difficulty. In other words, it is possible to produce an effect that a soft error tolerance can be enhanced.

Fifth Embodiment

Figure 17:
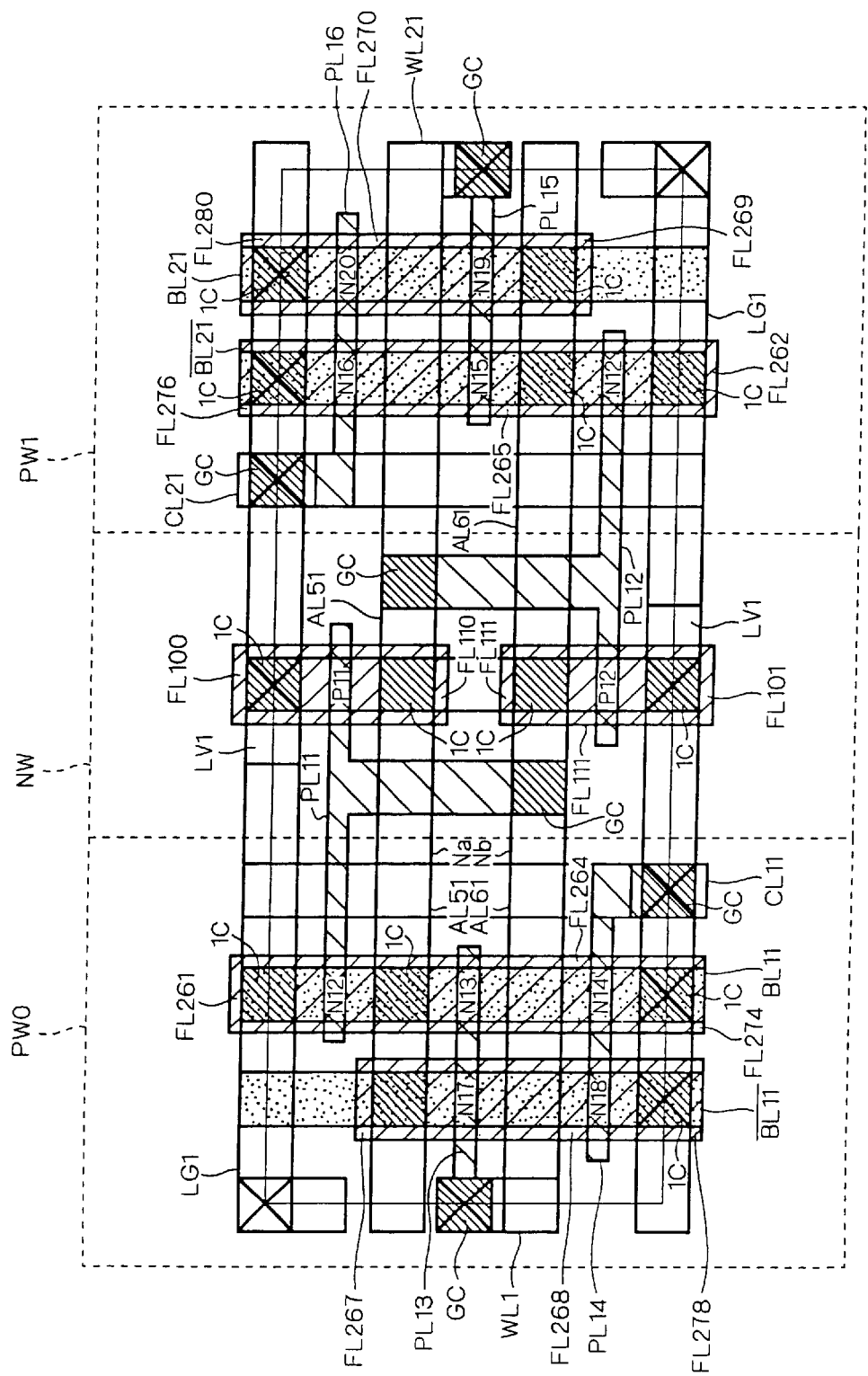
FIG. 17 is a view illustrating a layout structure of all layers of a memory cell in an SRAM according to a fifth embodiment of the present invention, which is seen on a plane.
Figure 18:
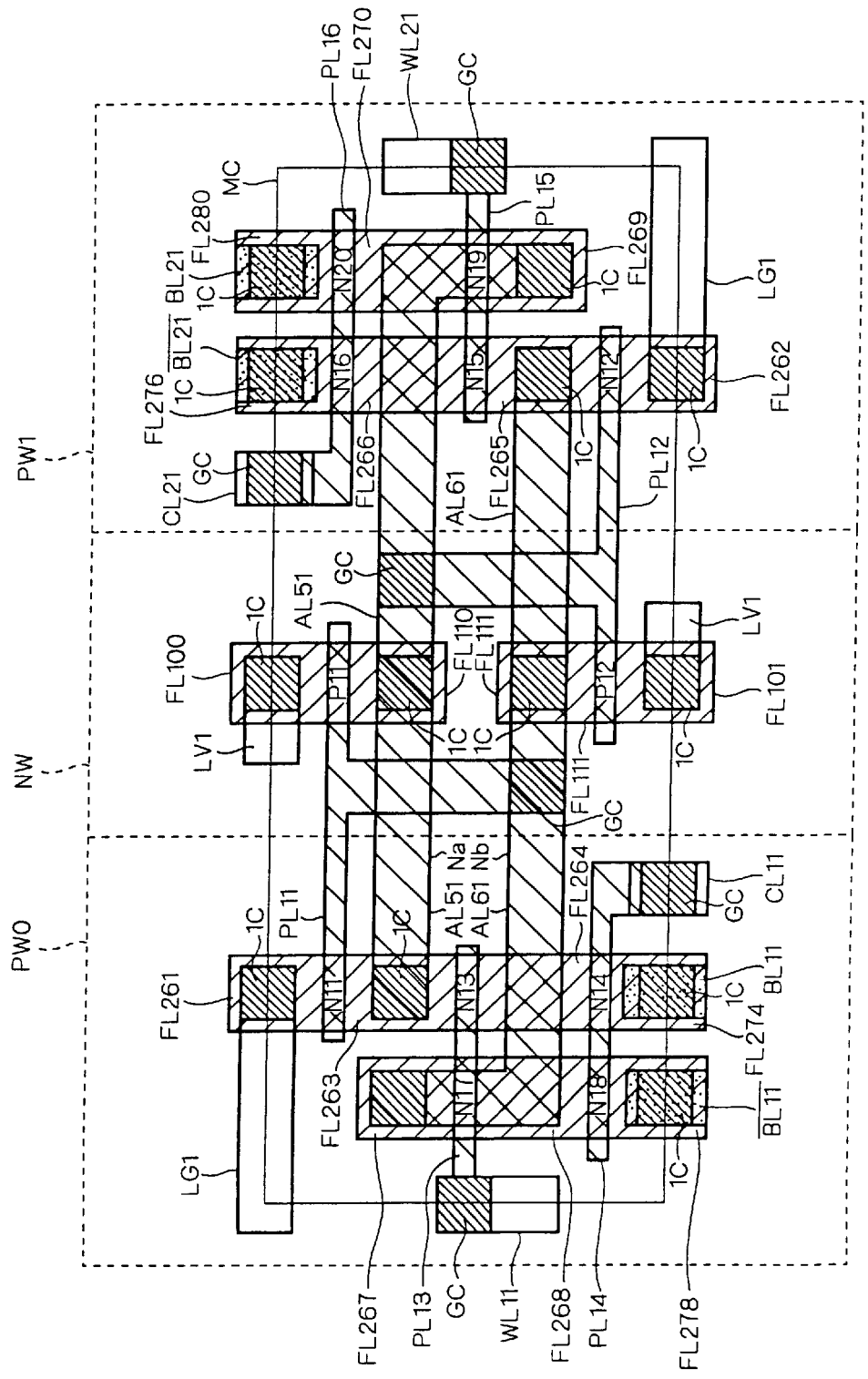
FIG. 18 is a view mainly illustrating a layout structure of a portion provided under a first aluminum wiring layer in FIG. 17, which is seen on a plane.
Figure 19:
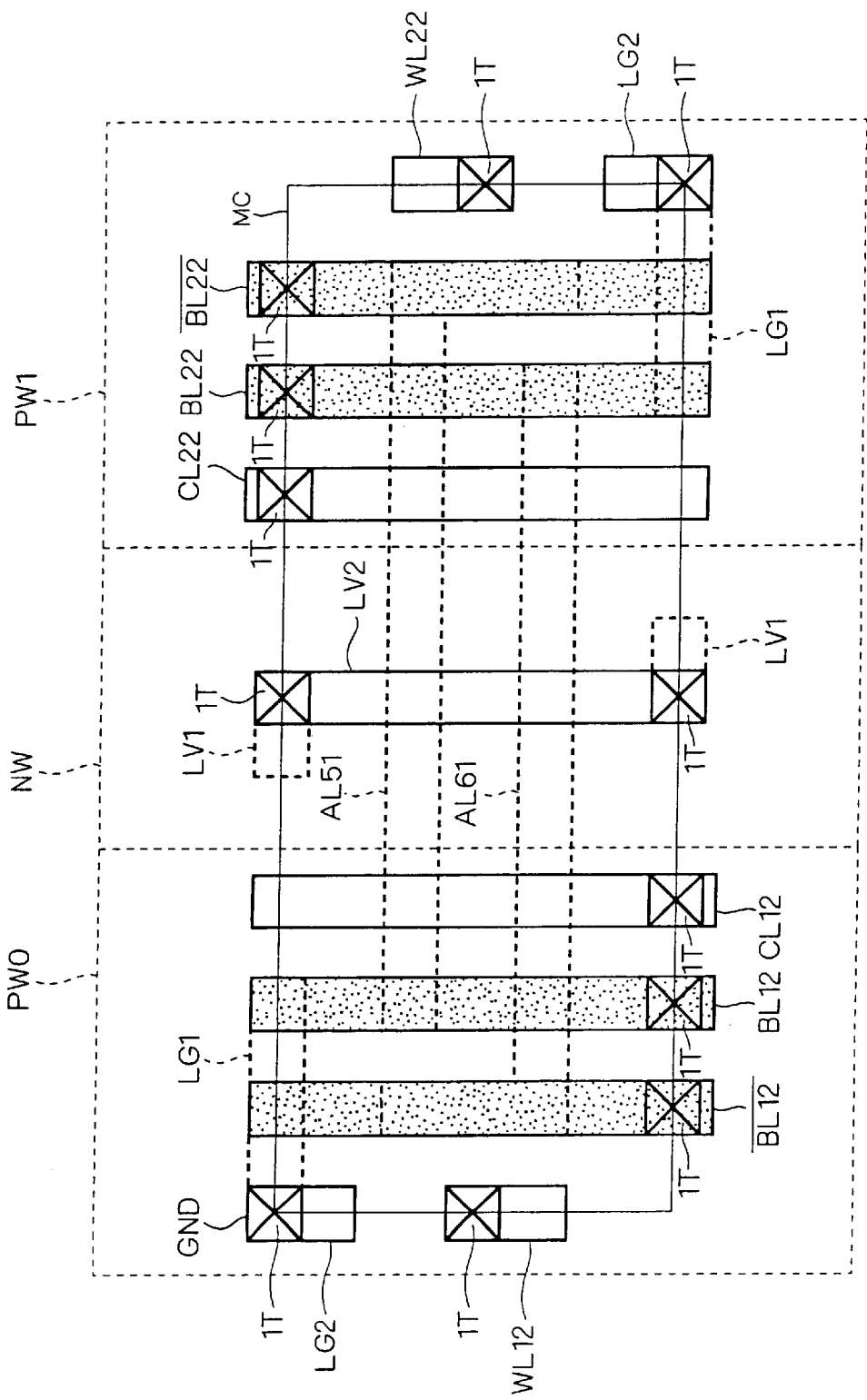
FIG. 19 is a view mainly illustrating a layout structure of a second aluminum wiring layer in FIG. 17, which is seen on a plane.
Figure 20:
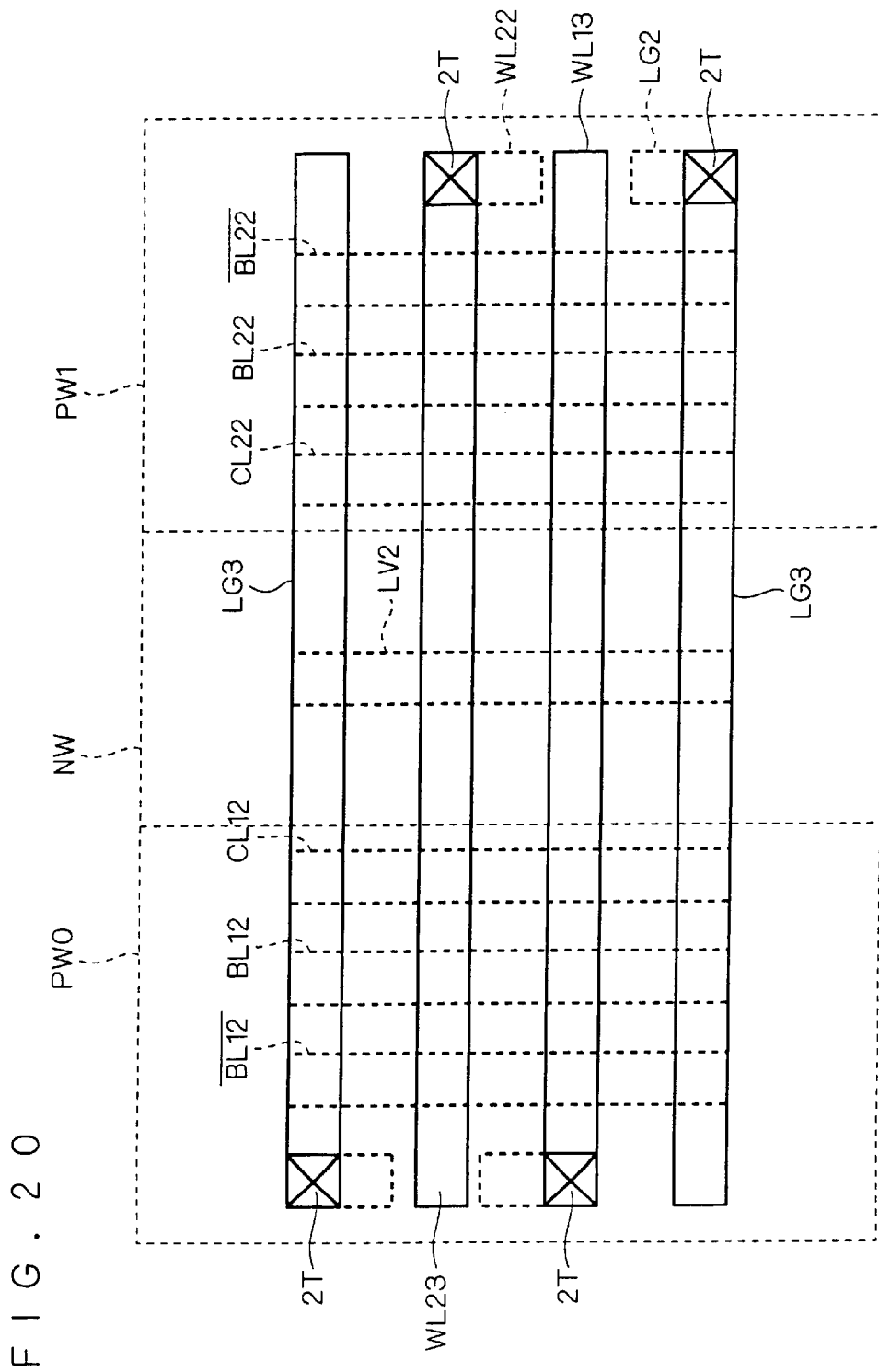
FIG. 20 is a view mainly illustrating a layout structure of a third aluminum wiring layer in FIG. 17, which is seen on a plane.
Figure 21:
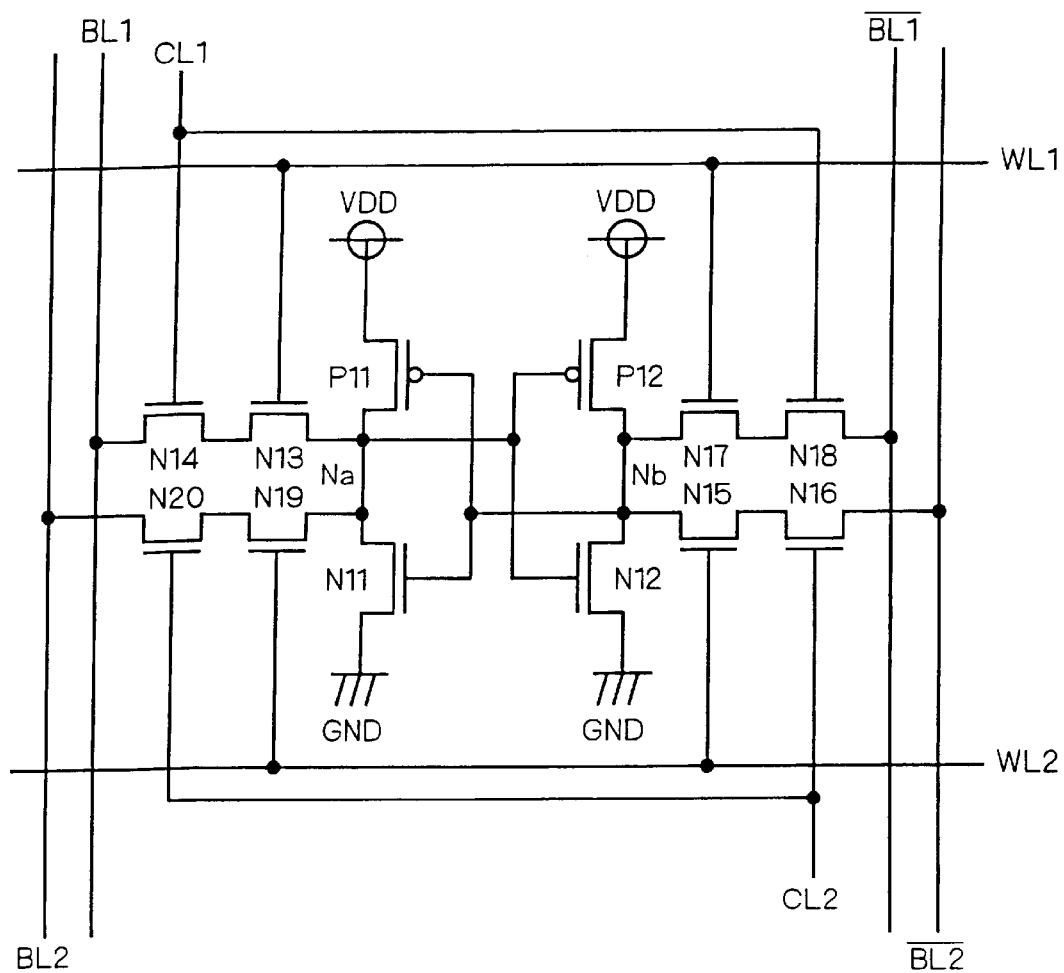
FIG. 21 is a circuit diagram showing an equivalent circuit of the memory cell according to the fifth embodiment illustrated in FIGS. 17 to 20.
Figure 22:
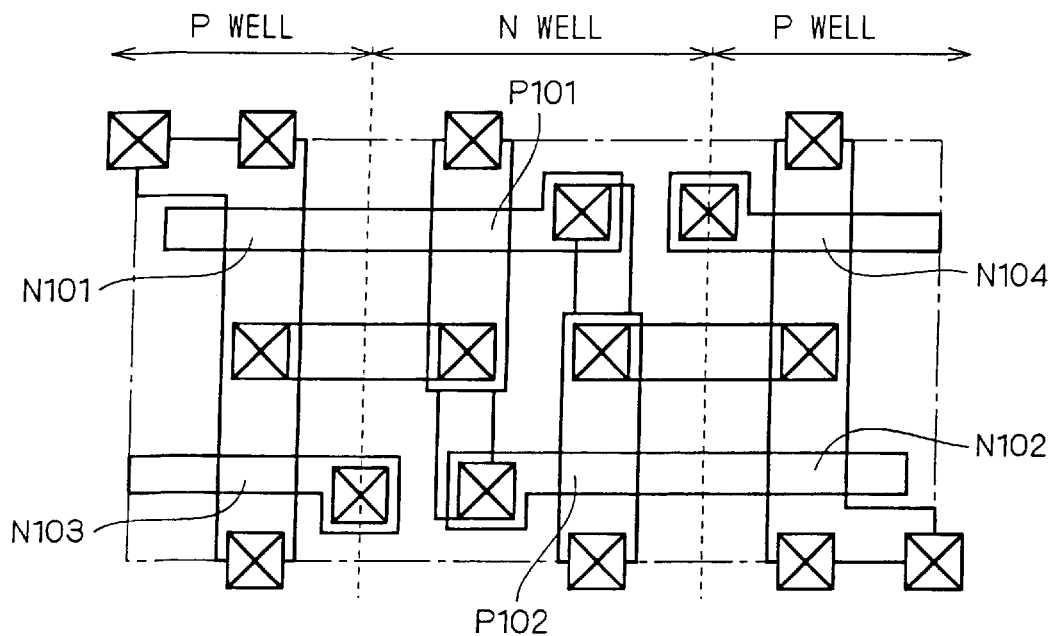
FIG. 22 is a view illustrating a layout structure of a lower part of a conventional semiconductor storage apparatus, which is seen on a plane.
Figure 23:
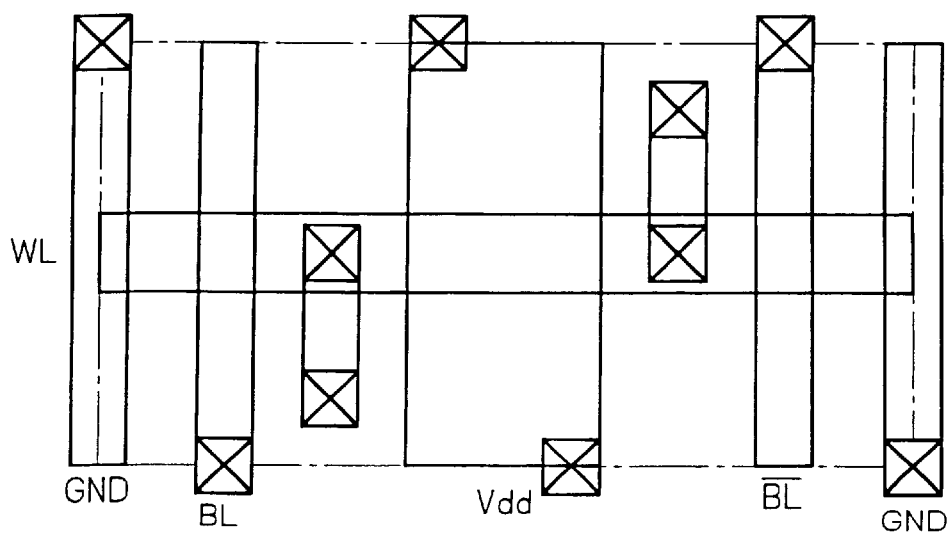
FIG. 23 is a view illustrating a layout structure of an upper part of the conventional semiconductor storage apparatus, which is seen on a plane.
Figure 24:
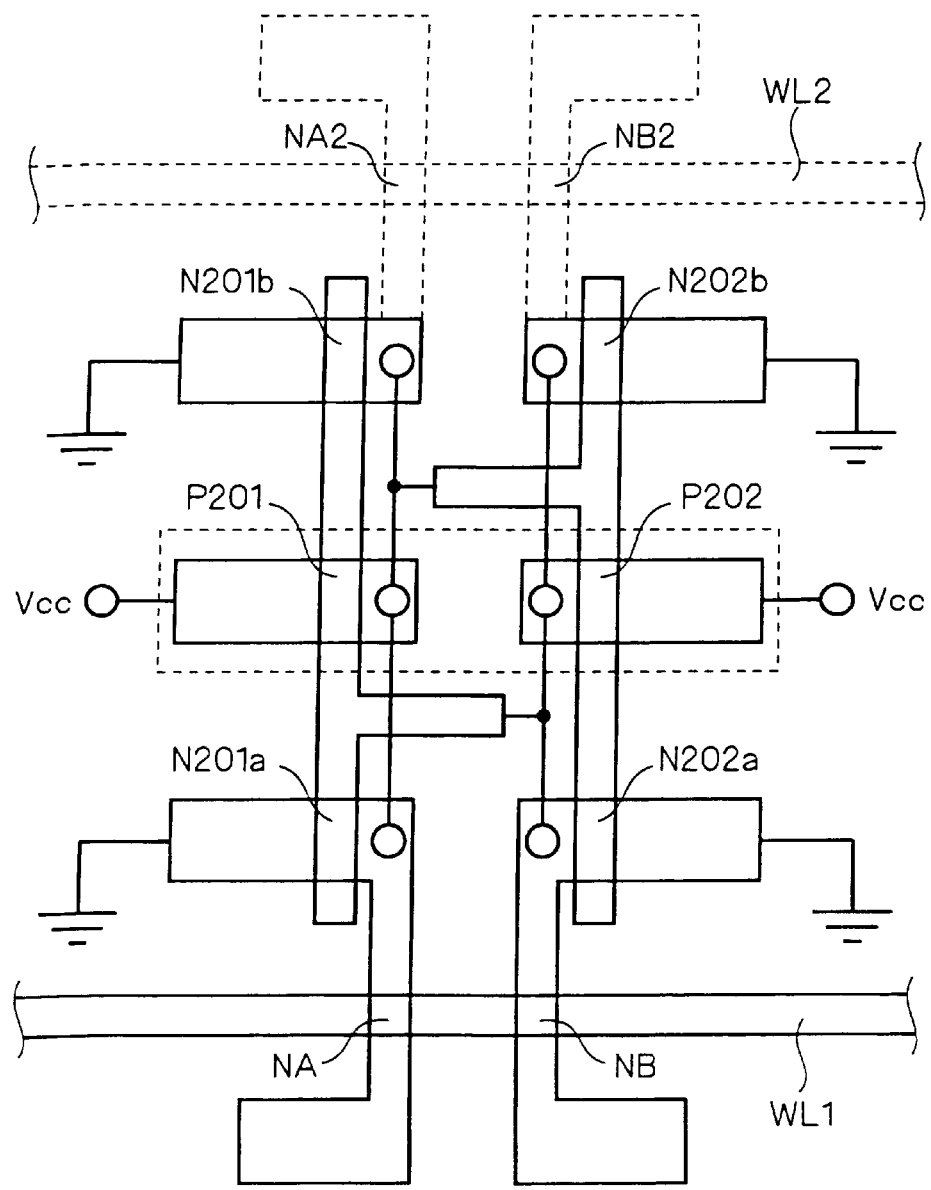
FIG. 24 is a view illustrating a layout structure of a storage cell of the conventional semiconductor storage apparatus.

FIG. 17 is a view illustrating a layout structure of all layers of a memory cell in an SRAM according to a fifth embodiment of the present invention, which is seen on a plane. FIG. 18 is a view mainly illustrating a layout structure of a portion provided under a first aluminum wiring layer in FIG. 17, which is seen on a plane. FIG. 19 is a view mainly illustrating a layout structure of a second aluminum wiring layer in FIG. 17, which is seen on a plane. FIG. 20 is a view mainly illustrating a layout structure of a third aluminum wiring layer in FIG. 17, which is seen on a plane. FIG. 21 is a circuit diagram showing an equivalent circuit of the memory cell according to the fifth embodiment illustrated in FIGS. 17 to 20.

More specifically, FIGS. 18 to 20 are supplementary views to FIG. 17, illustrating the layout structure shown in FIG. 17 which is divided every wiring layer for easy understanding. Some designations shown in FIGS. 18 to 20 are partially omitted in FIG. 17.

As shown in the equivalent circuit of FIG. 21, an NMOS transistor N11 and a PMOS transistor P11 constitute a first inverter and an NMOS transistor N12 and a PMOS transistor P12 constitute a second inverter. Output terminals of the first and second inverters are mutually connected to input terminals thereof, thereby constituting storage terminals Na and Nb.

An NMOS transistor N13 has a source connected to the storage terminal Na and a gate connected to a word line WL1. An NMOS transistor N14 has a gate connected to a column line CL1 and a drain connected to a bit line BL1. A drain of the NMOS transistor N13 is connected to a source of the NMOS transistor N14.

Similarly, an NMOS transistor N15 has a source connected to the storage terminal Nb and a gate connected to a word line WL2, an NMOS transistor N16 has a gate connected to a column line CL2 and a drain connected to a bit line $\overline{BL2}$, and a drain of the NMOS transistor N15 is connected to a source of the NMOS transistor N16.

An NMOS transistor N19 has a source connected to the storage terminal Na and a gate connected to the word line WL2. An NMOS transistor N20 has a gate connected to the column line CL2 and a drain connected to a bit line BL2. A drain of the NMOS transistor N19 is connected to a source of the NMOS transistor N20.

Similarly, an NMOS transistor N17 has a source connected to the storage terminal Nb and a gate connected to the word line WL1, an NMOS transistor N18 has a gate connected to the column line CL1 and a drain connected to a bit line $\overline{BL1}$, and a drain of the NMOS transistor N17 is connected to a source of the NMOS transistor N18.

By carrying out the connection as described above, an SRAM memory cell circuit of a 2-port low power consumption type is constituted.

As shown in FIGS. 17 to 20, the NMOS transistors N11, N13, N14, N17 and N18 are formed in a P well region PW0, the PMOS transistors P11 and P12 are formed in an N well region NW, and the NMOS transistors N12, N15, N16, N19 and N20 are formed in a P well region PW1. A specific structure of the MOS transistor will be described below in detail.

In the P well region PW0, the NMOS transistor N11 is constituted by a polysilicon wiring PL11 and N-type diffusion regions FL261 and FL263, the NMOS transistor N13 is constituted by a polysilicon wiring PL13, the N-type diffusion region FL263 and an N-type diffusion region FL264, and the NMOS transistor N14 is constituted by a polysilicon wiring PL14, the N-type diffusion region FL264 and an N-type diffusion region FL274.

Furthermore, the NMOS transistor N17 is constituted by a polysilicon wiring PL13 and N-type diffusion regions FL267 and FL268 and the NMOS transistor N18 is constituted by a polysilicon wiring PL14, the N-type diffusion region FL268 and an N-type diffusion region FL278.

In the P well region PW1, the NMOS transistor N12 is constituted by a polysilicon wiring PL12 and N-type diffusion regions FL262 and FL265, the NMOS transistor N15 is constituted by a polysilicon wiring PL15, the N-type diffusion region FL265 and an N-type diffusion region FL266, and the NMOS transistor N16 is constituted by a polysilicon wiring PL16, the N-type diffusion region FL266 and an N-type diffusion region FL276.

Furthermore, the NMOS transistor N19 is constituted by the polysilicon wiring PL15 and N-type diffusion regions FL269 and FL270 and the NMOS transistor N20 is constituted by the polysilicon wiring PL16, the N-type diffusion region FL270 and an N-type diffusion region FL280.

In the N well region NW, the PMOS transistor P11 is constituted by a polysilicon wiring PL11 and P-type diffusion regions FL100 and FL110, and the PMOS transistor P12 is constituted by a polysilicon wiring PL12 and P-type diffusion regions FL101 and FL111.

Gates of the PMOS transistor P11 and the NMOS transistor N12 are formed by the common polysilicon wiring PL11, and the polysilicon wiring PL11 is electrically connected through a gate contact GC to an aluminum wiring AL61 to be the storage terminal Nb. Similarly, gates of the PMOS transistor P12 and the NMOS transistor N11 are formed by the common polysilicon wiring PL12, and the polysilicon wiring PL12 is electrically connected through the gate contact GC to an aluminum wiring AL51 to be the storage terminal Na.

The aluminum wiring AL51 to be the storage terminal Na is electrically connected to the polysilicon wiring PL12 through the gate contact GC and is electrically connected through a contact hole 1C to the N-type diffusion regions FL263 and FL269 and the P-type diffusion region FL110 of the NMOS transistors N11 (N13) and N19 and the PMOS transistor P11.

The aluminum wiring AL61 to be the storage terminal Nb is electrically connected to the polysilicon wiring PL11 through the gate contact GC and is electrically connected through the contact hole 1C to the N-type diffusion regions FL265 and FL267 and the P-type diffusion region FL111 of the NMOS transistors N12 (N15) and N17 and the PMOS transistor P12.

The relationship between the layout structures shown in FIGS. 17 to 20 and the equivalent circuit of FIG. 21 will be described below.

The P-type diffusion regions FL100 and FL101 of the PMOS transistors P11 and P12 are set to have a power potential VDD through the contact hole 1C, a power wiring LV1 and a power wiring LV2 of a second layer which is electrically connected through a via hole 1T. More specifically, the P-type diffusion regions FL100 and FL101 correspond to the sources of the PMOS transistors P11 and P12 in FIG. 21.

Moreover, the N-type diffusion regions FL261 and FL262 of the NMOS transistors N11 and N12 are set to have a ground potential GND through the contact hole 1C, a ground wiring LG1, the via hole 1T, a ground wiring LG2 and a ground wiring LG3 which is electrically connected through a via hole 2T. More specifically, the N-type diffusion regions FL261 and FL262 correspond to the sources of the NMOS transistors N11 and N12 in FIG. 21.

The N-type diffusion region FL274 to be the drain of the NMOS transistor N14 is electrically connected to a bit line BL12 (corresponding to the BL1 in FIG. 21) through the contact hole 1C, a bit line BL11 and the via hole 1T.

Similarly, the N-type diffusion region FL276 to be the drain of the NMOS transistor N16 is electrically connected to a bit line $\overline{BL22}$ (corresponding to the $\overline{BL2}$ in FIG. 21) through the contact hole 1C, a bit line bar $\overline{BL21}$ and the via hole 1T.

Moreover, the N-type diffusion region FL280 to be the drain of the NMOS transistor N20 is electrically connected to the bit line $\overline{BL22}$ (corresponding to the $\overline{BL2}$ in FIG. 21) through the contact hole 1C, the bit line BL21 and the via hole 1T.

Similarly, the N-type diffusion region FL278 to be the drain of the NMOS transistor N18 is electrically connected to a bit line $\overline{BL12}$ (corresponding to the $\overline{BL1}$ in FIG. 21) through the contact hole 1C, a bit line $\overline{BL11}$ and the via hole 1T.

Moreover, the polysilicon wiring PL14 to be the gate of the NMOS transistors N14 and N18 is electrically connected to a column line CL12 (corresponding to the column line CL1 in FIG. 21) through the gate contact GC, a column line CL11 and the via hole 1T. Similarly, the polysilicon wiring PL16 to be the gate of the NMOS transistors N16 and N20 is electrically connected to a column line CL22 (corresponding to the column line CL2 in FIG. 21) through the gate contact GC, a column line CL21 and the via hole 1T.

The polysilicon wiring PL13 to be the gate of the NMOS transistors N13 and N17 is electrically connected to a word line WL13 (corresponding to the word line WL1 in FIG. 21) through the gate contact GC, a word line WL11, the via hole 1T, a word line WL12 and a via hole 2T.

Similarly, the polysilicon wiring PL15 to be the gate of the NMOS transistors N15 and N19 is electrically connected to a word line WL23 (corresponding to the word line WL2 in FIG. 21) through the gate contact GC, a word line WL21, the via hole 1T, a word line WL22 and the via hole 2T.

In the fifth embodiment, the N-type diffusion region to be electrically connected to the aluminum wiring AL51 to be the storage terminal Na is separately formed into the P well region PW0 (the N-type diffusion region FL263 (a drain of the NMOS transistor N11 and a source of the NMOS transistor N13)) and the P well region PW1 (the N-type diffusion region FL269 (a source of the NMOS transistor N19)). Similarly, the N-type diffusion region to be electrically connected to the aluminum wiring AL61 to be the storage terminal Nb is separately formed into the P well region PW0 (the N-type diffusion region FL267 (a source of the NMOS transistor N17)) and the P well region PW1 (the N-type diffusion region FL265 (a drain of the NMOS transistor N12 and a source of the NMOS transistor N15).

As a result, in the case in which electrons generated by a rays or neutron rays are collected into the N-type diffusion region formed in one of the P well regions PW0 and PW1, the electrons are discharged from the N-type diffusion region formed in the other P well region in which the influence of the generation of the electrons is prevented by the provision of the N well region NW. Consequently, there is an effect that a soft error tolerance can be enhanced in the same manner as in the fourth embodiment.

In addition, as shown in FIGS. 17 to 20, the NMOS transistors N11, N13, N14, N17 and N18 are formed in the P well region PW0, the NMOS transistors N12, N15, N16, N19 and N20 are formed in the P well region PW1, and a wiring direction of the bit line is set to be orthogonal to a direction of separation formation of the P well regions PW0 and PW1. In the same manner as in the first embodiment, consequently, it is possible to reduce a wiring length of the bit line as compared with a conventional 2-port memory cell of a low power consumption type using a column line. As a result, an access time can be shortened.

Moreover, a wiring direction of the column lines CL1 and CL2 (the column lines CL12 and CL22 in FIG. 19) is set to be orthogonal to a direction of separation arrangement of the P well regions PW0 and PW11. Consequently, it is possible to reduce the wiring lengths of the column lines CL1 and CL2 in the same manner as the bit lines BL1 and BL2. Furthermore, the word lines WL1 and WL2 (WL11 to WL13 and WL21 to WL23) are arranged in parallel with the direction of the separation arrangement of the P well regions PW0 and PW1. Consequently, the positional relationship on a layout orthogonal to the bit lines BL1 and BL2 can be maintained to be excellent.

Furthermore, the NMOS transistors N11, N13 and N14 and the NMOS transistors N17 and N18 are formed in the P well region PW0, and the NMOS transistors N12, N15 and N16 and the NMOS transistors N19 and N20 are formed in the P well region PW1. Consequently, it is possible to implement a layout structure in which two or three adjacent NMOS transistors share the diffusion region FL to be a source or a drain. As a result, the degree of integration can be enhanced. In addition, the NMOS transistors N11, N13 and N14, N17 and N18, N12, N15 and N16, and N19 and N20 are arranged on an almost straight line, respectively. Consequently, a wasteful region can be reduced to enhance the degree of integration.

Moreover, since the directions of formation of the polysilicon wirings PL11 to PL16 are identical to each other, a gate dimension can easily be controlled. In addition, the polysilicon wirings PL11 and PL16 (the MOS transistors N11, P11, N16 and N20), the polysilicon wirings PL13 and PL15 (the NMOS transistors N13, N17, N15 and N19), and the polysilicon wirings PL12 and PL14 (the MOS transistors N12, P12, N14 and N18) are arranged on a straight line, respectively. Therefore, a wasteful region can be prevented from being generated with the formation of the polysilicon wiring PL and an area can be reduced.

While BL11, BL21, $\overline{BL11}$ and $\overline{BL21}$ have been shown as the bit lines in FIGS. 17 to 20 for convenience of the description, the bit lines BL12, BL22, $\overline{BL12}$ and $\overline{BL22}$ correspond to original bit lines and the bit lines BL11, BL21, $\overline{BL11}$ and $\overline{BL21}$ are metal wirings to be provided intermediately. Similarly, the word lines WL11, WL12, WL21 and WL22, the column lines CL11 and CL21, the power wiring LV1, and the ground wirings LG1 and LG2 are metal wirings to be provided intermediately for electrical connection to the word lines W13 and WL23, the column lines CL12 and CL22, the power wiring LV2 and the ground wiring LG3.

Others

Conceptually, the N well region NW and the P well regions PW0 and PW1 described in the first to fifth embodiments comprise a general well region to be formed in an upper layer portion of a bulk semiconductor substrate, and furthermore, an element formation region to be formed on a semiconductor layer provided on an insulating surface of a substrate in an SOI substrate including the substrate having at least the surface and the semiconductor layer.

While the invention has been shown and described in detail, the foregoing description is in all aspects illustrative and not restrictive. It is therefore understood that numerous modifications and variations can be devised without departing from the scope of the invention.

What is claimed is:

1. A semiconductor storage apparatus including a memory cell having first and second inverters cross connected to each other, wherein first and second conductivity types are defined by one and another kinds, respectively, said first inverter has a first one kind field effect transistor and a first another kind field effect transistor, said second inverter has a second one kind field effect transistor and a second another kind field effect transistor, said first inverter has an output section including a connecting portion of one electrode of said first one kind field effect transistor and one electrode of said first another kind field effect transistor and an input section including a connecting portion of a control electrode of said first one kind field effect transistor and a control electrode of said first another kind field effect transistor, and said second inverter has an output section including a connecting portion of one electrode of said second one kind field effect transistor and one electrode of said second another kind field effect transistor and an input section including a connecting portion of a control electrode of said second one kind field effect transistor and a control electrode of said second another kind field effect transistor, said memory cell further having:

a third one kind field effect transistor having one electrode connected to a first storage terminal which is electrically connected to said output section of said first inverter and said input section of said second inverter and a control electrode connected to a row selection signal line;

a fourth one kind field effect transistor having one electrode connected to the other electrode of said third one kind field effect transistor, the other electrode connected to a first bit line and a control electrode connected to a first column selection signal line;

a fifth one kind field effect transistor having one electrode connected to a second storage terminal which is electrically connected to said output section of said second inverter and said input section of said first inverter and a control electrode connected to said row selection signal line; and a sixth one kind field effect transistor having one electrode connected to the other electrode of said fifth one kind field effect transistor, the other electrode connected to a second bit line and a control electrode connected to a second column selection signal line, wherein one of said first and second one kind field effect transistors is formed in a first another kind well region and the other is formed in a second another kind well region, said third and fourth one kind field effect transistors are formed in said first another kind well region, said fifth and sixth one kind field effect transistors are formed in said second another kind well region, said first and second another kind field effect transistors are formed in a one kind well region, and said first and second another kind well regions are arranged in a first direction with said one kind well region interposed therebetween and said first and second bit lines are extended in a second direction which is almost orthogonal to said first direction.

2. The semiconductor storage apparatus according to claim 1, wherein said first one kind field effect transistor is formed in said first another kind well region, and said second one kind field effect transistor is formed in said second another kind well region.

3. The semiconductor storage apparatus according to claim 2, wherein said first and sixth one kind field effect transistors and said first another kind field effect transistor are arranged on an almost straight line in said first direction, and said second and fourth one kind field effect transistors and said second another kind field effect transistor are arranged on an almost straight line in said first direction.

4. The semiconductor storage apparatus according to claim 2, wherein said first, third and fourth one kind field effect transistors are arranged on an almost straight line in said second direction, and said second, fifth and sixth one kind field effect transistors are arranged on an almost straight line in said second direction.

5. The semiconductor storage apparatus according to claim 1, wherein said first and second column selection signal lines are extended in said second direction.

6. The semiconductor storage apparatus according to claim 1, wherein said row selection signal line is extended in said first direction.

7. The semiconductor storage apparatus according to claim 1, wherein
said control electrodes of said third and fifth one kind field effect transistors include a polysilicon layer formed in common from said first another kind well region to said second another kind well region.

8. The semiconductor storage apparatus according to claim 1, wherein
said memory cell includes a plurality of memory cells adjacent to each other, and
said first and second bit lines of each of said memory cells are formed in the vicinity of a boundary of a memory cell region, thereby sharing said first and second bit lines between said memory cells adjacent to each other.

9. The semiconductor storage apparatus according to claim 1, wherein
said first one kind field effect transistor is formed in said second another kind well region, and
said second one kind field effect transistor is formed in said first another kind well region.

10. The semiconductor storage apparatus according to claim 1, wherein
said row selection signal line includes first and second row selection signal lines,
said first bit line includes a first positive-phase-sequence bit line and a first negative-phase-sequence bit line,
said second bit line includes a second positive-phase-sequence bit line and a second negative-phase-sequence bit line,
said control electrode of said third one kind field effect transistor is connected to said first row selection signal line,
the other electrode of said fourth one kind field effect transistor is connected to said first positive-phase-sequence bit line,
said control electrode of said fifth one kind field effect transistor is connected to said second row selection signal line, and
the other electrode of said sixth field effect transistor is connected to said second negative-phase-sequence bit line,
said memory cell including:
    a seventh one kind field effect transistor having one electrode connected to said second storage terminal and a control electrode connected to said first row selection signal line;
    an eighth one kind field effect transistor having one electrode connected to the other electrode of said seventh one kind field effect transistor, the other electrode connected to a first negative-phase-sequence bit line and a control electrode connected to said first column selection signal line;
    a ninth one kind field effect transistor having one electrode connected to said first storage terminal and a control electrode connected to said second row selection signal line; and
    a tenth one kind field effect transistor having one electrode connected to the other electrode of said ninth one kind field effect transistor, the other electrode connected to a second positive-phase-sequence bit line and a control electrode connected to said second column selection signal line, wherein
        said seventh and eighth one kind field effect transistors are formed in said first another kind well region,
        said ninth and tenth one kind field effect transistors are formed in said second another kind well region, and
        said first and second positive-phase-sequence bit lines and said first and second negative-phase-sequence bit lines are extended in said second direction.

11. The semiconductor storage apparatus according to claim 1, wherein
said one kind well region and said first and second another kind well regions include an element formation region formed in a semiconductor layer of an SOI substrate which consists of an insulating substrate having at least an insulating surface and said semiconductor layer formed on said insulating substrate.

* * * * *